US008188491B2

United States Patent
Seo et al.

(10) Patent No.: US 8,188,491 B2
(45) Date of Patent: *May 29, 2012

(54) LIGHT EMITTING DEVICE

(75) Inventors: Satoshi Seo, Kawasaki (JP); Daisuke Kumaki, Tokamachi (JP); Hisao Ikeda, Atsugi (JP); Junichiro Sakata, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/009,111

(22) Filed: Jan. 19, 2011

(65) Prior Publication Data
US 2011/0108864 A1  May 12, 2011

Related U.S. Application Data

(63) Continuation of application No. 12/564,233, filed on Sep. 22, 2009, now Pat. No. 7,875,893, which is a continuation of application No. 10/577,127, filed as application No. PCT/JP2005/018062 on Sep. 22, 2005, now Pat. No. 7,601,988.

(30) Foreign Application Priority Data

Sep. 24, 2004  (JP) ................... 2004-278520
Oct. 29, 2004  (JP) ................... 2004-316089
Oct. 29, 2004  (JP) ................... 2004-316228

(51) Int. Cl.
    *H01L 35/24* (2006.01)
(52) U.S. Cl. .............. 257/88; 257/101; 257/E51.018
(58) Field of Classification Search .......... 257/88–98, 257/101–103, 79, E51.018, E51.019, E51.022, 257/E51.026–E51.029, E51.03–E51.052, 257/E33.002–E33.004
See application file for complete search history.

(56) References Cited

U.S. PATENT DOCUMENTS 5,670,792 A   9/1997  Utsugi et al.
(Continued)

FOREIGN PATENT DOCUMENTS

CN   1327360   12/2001
(Continued)

OTHER PUBLICATIONS

International Search Report (Application No. PCT/JP2005/018062) dated Jan. 17, 2006.
(Continued)

*Primary Examiner* — Zandra Smith
*Assistant Examiner* — Paul Patton
(74) *Attorney, Agent, or Firm* — Eric J. Robinson; Robinson Intellectual Property Law Office, P.C.

(57) ABSTRACT

Light-emitting elements have a problem that their light-extraction efficiency is low due to scattered light or reflected light inside the light-emitting elements. The light-extraction efficiency of the light-emitting elements needs to be enhanced by a new method. According to the present invention, a light-emitting element includes a first layer generating holes, a second layer including a light-emitting layer for each emission color and a third layer generating electrons between an anode and a cathode, and the thickness of the first layer is different depending on each layer including the light-emitting layer for each emission color. A layer in which an organic compound and a metal oxide are mixed is used as the first layer, and thus, the driving voltage is not increased even when the thickness is increased, which is preferable.

32 Claims, 21 Drawing Sheets

U.S. PATENT DOCUMENTS

| | | | |
|---|---|---|---|
| 5,837,391 A | 11/1998 | Utsugi | |
| 6,013,384 A | 1/2000 | Kido et al. | |
| 6,091,195 A | 7/2000 | Forrest et al. | |
| 6,111,274 A | 8/2000 | Arai | |
| 6,384,529 B2 | 5/2002 | Tang et al. | |
| 6,423,429 B2 | 7/2002 | Kido et al. | |
| 6,454,966 B1 | 9/2002 | Kobayashi et al. | |
| 6,541,130 B2* | 4/2003 | Fukuda | 428/690 |
| 6,573,650 B2 | 6/2003 | Aoki et al. | |
| 6,589,673 B1 | 7/2003 | Kido et al. | |
| 6,650,047 B2 | 11/2003 | Aoki et al. | |
| 6,737,800 B1 | 5/2004 | Winters et al. | |
| 6,811,808 B2 | 11/2004 | Ohshita et al. | |
| 6,844,672 B2 | 1/2005 | Yamazaki | |
| 6,969,948 B2 | 11/2005 | Urabe et al. | |
| 6,971,938 B2 | 12/2005 | Urabe et al. | |
| 7,030,553 B2 | 4/2006 | Winters et al. | |
| 7,059,928 B2 | 6/2006 | Ikeda | |
| 7,102,282 B1 | 9/2006 | Yamada et al. | |
| 7,122,845 B2 | 10/2006 | Uchida | |
| 7,173,373 B2 | 2/2007 | Yamada et al. | |
| 7,187,120 B2 | 3/2007 | Ohshita et al. | |
| 7,218,049 B2 | 5/2007 | Yamada et al. | |
| 7,247,512 B2 | 7/2007 | Yamazaki | |
| 7,306,978 B2 | 12/2007 | Yamazaki et al. | |
| 7,323,225 B2 | 1/2008 | Aoki et al. | |
| 7,365,488 B2 | 4/2008 | Lee et al. | |
| 7,416,464 B2 | 8/2008 | Ikeda | |
| 7,508,127 B2 | 3/2009 | Miura et al. | |
| 7,579,203 B2 | 8/2009 | Yamazaki et al. | |
| 7,601,988 B2* | 10/2009 | Seo et al. | 257/88 |
| 7,710,025 B2 | 5/2010 | Yamada et al. | |
| 7,875,893 B2* | 1/2011 | Seo et al. | 257/88 |
| 7,973,319 B2 | 7/2011 | Kashiwabara et al. | |
| 2003/0185970 A1 | 10/2003 | Ohshita et al. | |
| 2004/0151829 A1 | 8/2004 | Boroson et al. | |
| 2005/0098207 A1 | 5/2005 | Matsumoto et al. | |
| 2005/0249974 A1 | 11/2005 | Mori et al. | |
| 2006/0158403 A1 | 7/2006 | Kuma | |
| 2007/0102737 A1 | 5/2007 | Kashiwabara et al. | |
| 2011/0241038 A1 | 10/2011 | Kashiwabara et al. | |

FOREIGN PATENT DOCUMENTS

| | | |
|---|---|---|
| CN | 1426269 | 6/2003 |
| EP | 0 855 848 | 7/1998 |
| EP | 0948063 A | 10/1999 |
| EP | 1 052 708 | 11/2000 |
| EP | 1 089 361 | 4/2001 |
| EP | 1 128 438 | 8/2001 |
| EP | 1 154 676 | 11/2001 |
| EP | 1449904 A | 8/2004 |
| EP | 1 530 245 | 5/2005 |
| EP | 1672962 A | 6/2006 |
| EP | 1771042 A | 4/2007 |
| EP | 2154737 A | 2/2010 |
| EP | 2169738 A | 3/2010 |
| JP | 07-094278 A | 4/1995 |
| JP | 10-270172 | 10/1998 |
| JP | 11-251067 A | 9/1999 |
| JP | 2000-315581 A | 11/2000 |
| JP | 2000-323277 | 11/2000 |
| JP | 2001-176673 A | 6/2001 |
| JP | 2001-237068 A | 8/2001 |
| JP | 2001-244079 | 9/2001 |
| JP | 2002-056973 | 2/2002 |
| JP | 2003-092191 A | 3/2003 |
| JP | 2003-142277 | 5/2003 |
| JP | 2004-119201 | 4/2004 |
| JP | 2004-235154 A | 8/2004 |
| JP | 2004-247137 | 9/2004 |
| JP | 2004-253389 A | 9/2004 |
| JP | 2004-355975 | 12/2004 |
| JP | 2005-093348 A | 4/2005 |
| JP | 2005-093396 | 4/2005 |
| JP | 2005-093399 | 4/2005 |
| JP | 2005-093401 | 4/2005 |
| JP | 2005-116516 A | 4/2005 |
| JP | 2005-156871 | 6/2005 |
| JP | 2005-166637 | 6/2005 |
| JP | 2005-302313 | 10/2005 |
| JP | 2005-322435 | 11/2005 |
| JP | 2007-503093 | 2/2007 |
| WO | WO 01/15244 | 3/2001 |
| WO | WO-01/39554 | 5/2001 |
| WO | WO-2004/064453 | 7/2004 |
| WO | WO-2005/020344 | 3/2005 |
| WO | WO-2006/009039 | 1/2006 |

OTHER PUBLICATIONS

Written Opinion (Application No. PCT/JP2005/018062) dated Jan. 17, 2006.

T. Nakada et al., *Multi Photon Emission Organic El Devices Using Charge-Transfer Complex as Charge Generation Layer*, The 63$^{rd}$ Autumn Meeting, IMES, Yamagata Univ., Sep. 24, 2002, 27a-ZL-12, p. 1165.

Office Action (Application No. 200580031996.1) dated Sep. 26, 2008.

Kido et al., "Bright Organic Electroluminescent Devices Having a Metal-Doped Electron-Injecting Layer," Appl. Phys. Lett. (Applied Physics Letters), Nov. 16, 1998, vol. 73, No. 20, pp. 2866-2868.

Search Report (Application No. 05787887.8) dated Jun. 23, 2010.

\* cited by examiner

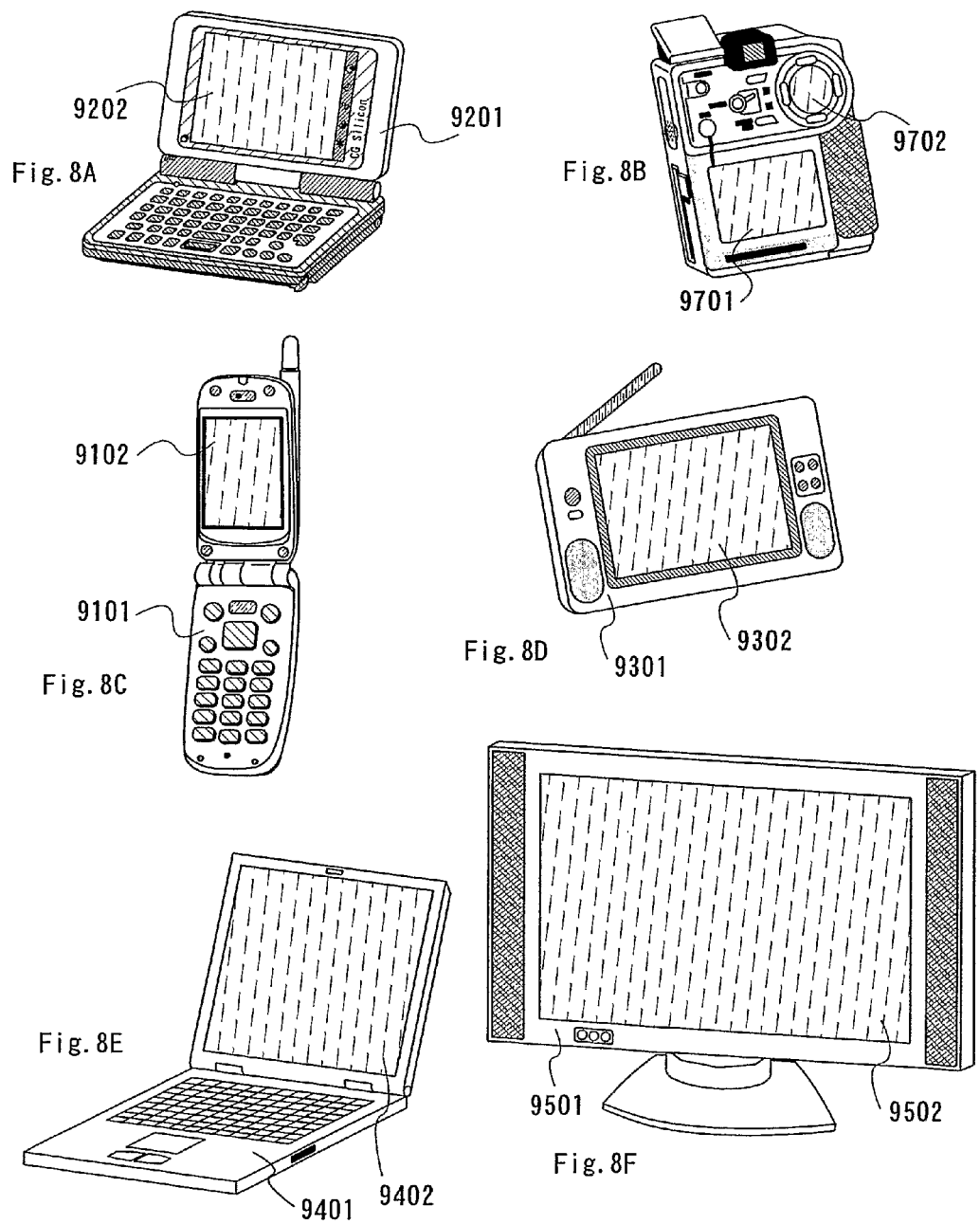

LIGHT EMITTING DEVICE

TECHNICAL FIELD

The present invention relates to a light-emitting element having a light-emitting layer, a light-emitting device having the light-emitting element, and a manufacturing method thereof.

BACKGROUND ART

A light-emitting element having a light-emitting layer has been used for a display recently. Such a display using a light-emitting element has advantageous effects such as a wide viewing angle, a high-response speed and low power consumption, as compared with a display having a liquid-crystal layer, and thus, has been developed actively.

Light-emitting elements have a problem that their light-extraction efficiency is low due to scattered light or reflected light inside the light-emitting elements. The light-extraction efficiency needs to be enhanced.

In order to enhance the light-extraction efficiency, there is proposed a structure in which a transparent electrode used for an electrode of a light-emitting element has a different thickness according to emission colors (Reference 1: Japanese Patent Laid-Open No. 2003-142277).

DISCLOSURE OF INVENTION

It is an object of the present invention to enhance the light-extraction efficiency of a light-emitting element by a method different from that of Reference 1.

In order to achieve the object, a thickness of a layer constituting a part of a light-emitting element is made different depending on each emission color, which is one feature of the present invention.

One mode of the present invention is a light-emitting device comprising a plurality of light-emitting elements. The plurality of light-emitting elements each include a first electrode and a second electrode; and a first layer, a second layer and a third layer which are sequentially formed between the first electrode and the second electrode, wherein the first layer serves as a layer generating holes, the second layer serves as a layer including a light-emitting layer for each emission color, and the third layer serves as a layer generating electrons, and the thickness of the first layer is different depending on each layer including a light-emitting layer.

Another mode of the present invention is a light-emitting device comprising a plurality of light-emitting elements. The plurality of light-emitting elements each include a first electrode that has a non-light-transmitting property and a second electrode that has a light-transmitting property; a first layer, a second layer and a third layer which are sequentially formed between the first electrode and the second electrode, wherein the first layer serves as a layer generating holes, the second layer serves as a layer including a light-emitting layer for emission colors, and the third layer serves as a layer generating electrons, and the thickness of the first layer is different depending on each of the emission colors so that light emitted from the light-emitting layer and reflected light, which has been emitted from the light-emitting layer and is reflected on the first electrode, can enhance each other.

One feature of the present invention is that the first layer is a layer in which an organic compound and a metal oxide that is an inorganic compound are mixed.

According to the present invention, a light-emitting device having the light-emitting element and a transistor for controlling current supplied to the light-emitting element can be provided.

One feature of the present invention is that the thickness of a layer constituting a part of a light-emitting element is made different according to each color of color filters and the like. The case of using a color filter overlapped with a color conversion layer is also included in the color filter and the like described above.

A specific mode of the present invention is a light-emitting device comprising: a plurality of types of color filters having different optical characteristics; a first electrode and a second electrode; and a first layer, a second layer and a third layer sequentially formed between the first electrode and the second electrode, wherein any of the first to third layers has an organic material and a metal oxide, and the thickness of the layer having the organic material and the metal oxide is different depending on each of the optical characteristics.

Another mode of the present invention is a light-emitting device comprising: a semiconductor film; a first electrode and a second electrode formed over the semiconductor film; a first layer, a second layer and a third layer sequentially formed between the first electrode and the second electrode, a plurality of types of color filters having different optical characteristics, which are formed on the first electrode side (on the emission side), wherein the first electrode has a light-transmitting property; the first layer serves as a layer generating holes, the second layer serves as a layer including a light-emitting layer, and the third layer serves as a layer generating electrons; the first layer has an organic material and a metal oxide; and the thickness of the first layer is different depending on each of the optical characteristics.

The plurality of types of color filters having different optical characteristics mean, for example, color filters having optical characteristics of red (R), green (G) and blue (B). Such optical characteristics of red (R), green (G) and blue (B) can be obtained also in the case of using color filters overlapped with color conversion layers. A function of color filters and the like provided in a display device can be obtained by using the plurality of types of color filters. Thus, making thicknesses of light-emitting elements different depending on optical characteristics means making thicknesses of light-emitting elements different in regions corresponding to each color filter and the like. Hereinafter, it is referred to as making thicknesses of light-emitting elements different depending on each color filter.

According to the present invention, the metal oxide is molybdenum oxide, vanadium oxide or rhenium oxide. A nitride or an oxynitride of the metal described above may be used instead of the metal oxide.

As described above, the thickness of at least one of the first to third layers is made different depending on each emission color, thereby preventing the light-extraction efficiency from decreasing. Consequently, the maximum light-extraction efficiency can be obtained. At this time, the thickness of a layer between a reflective electrode and a layer in which electrons and holes are recombined (i.e., a light-emitting layer) may be made different depending on each emission color.

Further, it is preferable that a layer in which an organic compound and a metal oxide that is an inorganic compound are mixed is used as a layer to be made thicker, since a voltage to be applied so as to obtain a predetermined current (also referred to as a driving voltage) does not become high. Consequently, lower power consumption of a light-emitting device can be achieved.

One feature of the present invention is that the thickness of at least one of the first to third layers is made different depending on each color filter and the like. At this time, the thickness of a layer between a reflective electrode and a layer in which electrons and holes are recombined (i.e., a light-emitting layer) may be made different depending on each color filter. As a result, it is possible to prevent the light-extraction efficiency from decreasing.

Further, it is preferable that a layer in which an organic compound and a metal oxide that is an inorganic compound are mixed is used as a layer to be made thicker, since a driving voltage does not become high. Consequently, lower power consumption can be achieved.

BRIEF DESCRIPTION OF DRAWINGS

In the accompanying drawings:

FIGS. 8A to 8F each show an electronic device having a light-emitting element according an aspect of the present invention;

BEST MODE FOR CARRYING OUT THE INVENTION

Figure 1:
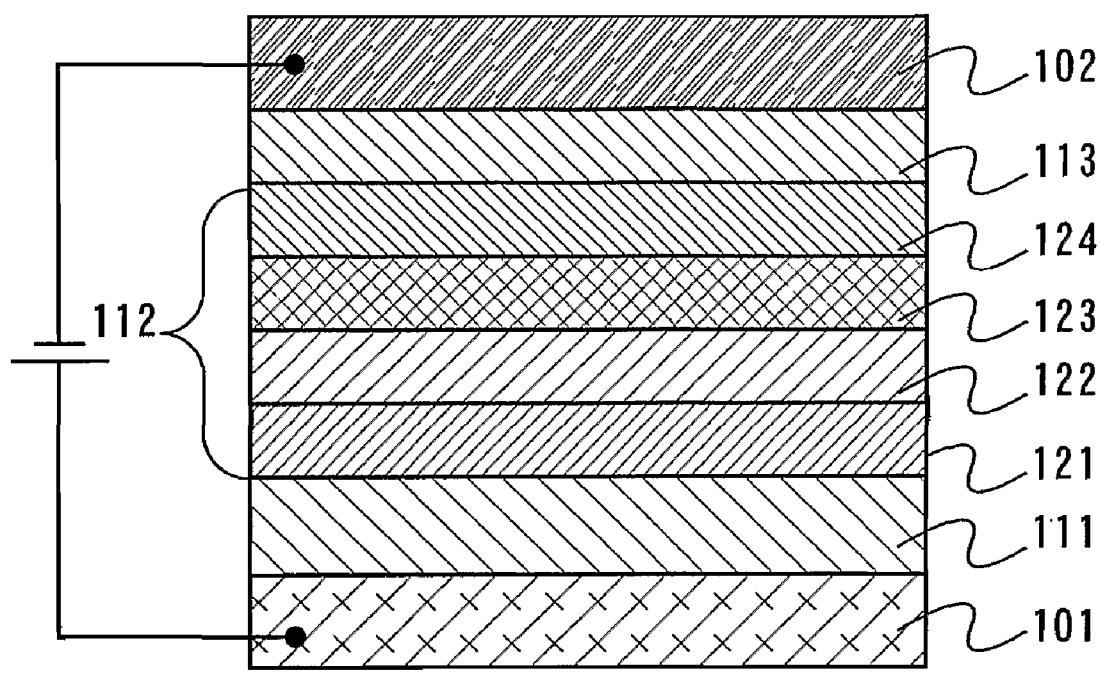
FIG. 1 shows a light-emitting element according an aspect of the present invention.

Embodiment Modes according to the present invention will hereinafter be described with reference to the accompanying drawings. The present invention can be carried out in many different modes, and it is easily understood by those skilled in the art that modes and details herein disclosed can be modified in various ways without departing from the spirit and the scope of the present invention. It should be noted that the present invention should not be interpreted as being limited to the description of the embodiment modes to be given below. The same reference numerals are used for the same portions and the portions with similar functions in all drawings, and the description thereof is not repeated.

Embodiment Mode 1

Embodiment Mode 1 describes a structure of a light-emitting element.

As shown in FIG. 1, a light-emitting element of the present invention includes a first electrode 101 and a second electrode 102 that are opposed to each other, and a first layer 111, a second layer 112 and a third layer 113 are stacked in this order over the first electrode 101. In such a light-emitting element, holes are injected into the second layer 112 from the first layer 111 and electrons are injected into the second layer 112 from the third layer 113, when a voltage is applied to the light-emitting element such that a potential of the first electrode 101 are higher than that of the second electrode 102. The holes and electrons are recombined in the second layer 112 to excite a light-emitting substance. The excited light-emitting substance emits light when returning to the ground state.

It is one feature of such light-emitting elements that the thickness of at least one of the layers except the first electrode and the second electrode is made different in each of light-emitting elements exhibiting emission colors. Therefore, the light-extraction efficiency can be increased.

Figure 2:
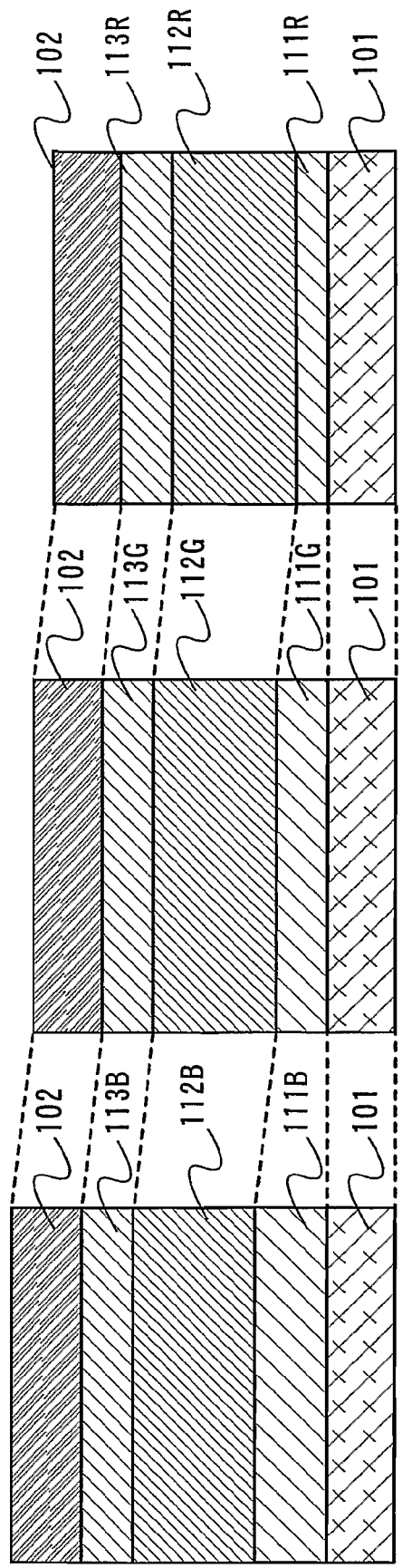
FIG. 2 shows a light-emitting element according an aspect of the present invention.

For example, as shown in FIG. 2, light-emitting elements that emit light of red (R), green (G) and blue (B) share the first electrode 101 that has a non-light-transmitting property and the second electrode 102 that has a light-transmitting property, and further have first layers 111R, 111G and 111B, second layers 112R, 112G and 112B, and third layers 113R, 113G and 113B. The thicknesses of the first layers 111R, 111G and 111B are made different depending on each emission color.

Consequently, it is possible to prevent decrease of the light-extraction efficiency due to the differences in light paths when light is recognized directly through the second electrode and when light is recognized after it is reflected on the first electrode and passes through the second electrode.

Specifically, when light enters the first electrode, phase reversal is generated in the reflected light, thereby generating the effect of interference of light for reflected light and direct light. At this time, in the case where an optical distance between the light-emitting layer and the reflective electrode (i.e., refractive index×distance) is (2 m−1)/4-fold (m is a given positive integer) of the emission wavelength, or, in the case where the optical distance is ¼, ¾, 5/4 . . . -fold of the emission wavelength, the light extraction efficiency is increased. In the meanwhile, in the case where the optical distance is m/2 times (m is a given positive integer), or, ½, 1, 3/2 . . . -fold of the emission wavelength, the light-extraction efficiency is reduced.

Therefore, in the light-emitting element of the present invention, the thickness of at least one of the first to third layers is made different in each light-emitting element so that the optical distance between the light-emitting region and the reflective electrode, in other words, refractive index×distance, is (2 m−1)/4 fold (m is a given positive integer) of the emission wavelength.

Specifically, in the first to third layers, although the thickness of a layer between the layer in which electrons and holes are recombined (i.e., light-emitting layer) and the reflective electrode may be made different, the thickness of the layer between the layer in which electrons and holes are recombined and a light-transmitting electrode may be made different. Alternatively, the thicknesses of the both layers may be made different. Consequently, light can be extracted outside efficiently.

Specifically, when the first to third layers are formed by an evaporation method using an evaporation mask, and the thickness of at least one of the layers is made different, the same evaporation mask can be used. On the other hand, as described in Reference 1, a photolithography process and an etching process are needed so as to make the thickness of an electrode different, and thus the number of processes is increased.

In this manner, according to the present invention, the decrease of the light-extraction efficiency can be prevented without increasing the number of processes.

In addition, according to the present invention typified by FIG. 2, the thickness of the light-emitting element that generates blue light is the thickest. This is because m is 2 in the light-emitting element for blue light and m is 1 in the light-emitting elements for red and green light. In the light-emitting element for blue light, in the case of m=1, the thickness becomes extremely small. However, in the case of m=2, the thickness becomes large and thus, the productivity can be enhanced. As just described, according to the present invention, the values of m are not necessarily equal in each color, and the design margin of the thickness of the light-emitting elements can be widened by selecting the values of m.

Because the thickness of any of the first to third layers is made different, a layer is needed to be thicker. Thus, one feature of the present invention is that a layer in which an organic compound and a metal oxide that is an inorganic compound are mixed is used as the layer to be made thicker.

Commonly, when the thickness of a layer in the light-emitting element becomes large, the driving voltage also increases, which is not preferable. However, as described in Embodiments below, the present inventors have found that the driving voltage itself can be lowered by using a layer in which an organic compound and a metal oxide that is an inorganic compound are mixed as the layer to be made thicker, without increasing the driving voltage.

By making at least one of the first to third layers thicker, a short circuit between the first and second electrodes can be prevented, and productivity can be enhanced, which is preferable.

As described above, one feature of the present invention is that the thickness of at least one of the first to third layers is made different depending on each emission color. At this time, the thickness of a layer between a reflective electrode and a layer in which electrons and holes are recombined (i.e., light-emitting layer) may be made different depending on each emission color. Further, it is preferable that a layer in which an organic compound and a metal oxide that is an inorganic compound are mixed is used as the layer to be made thicker, since a driving voltage does not become high.

Embodiment Mode 2

Embodiment Mode 2 describes a structure of a light-emitting element which is different from that of Embodiment Mode 1.

Figure 15:
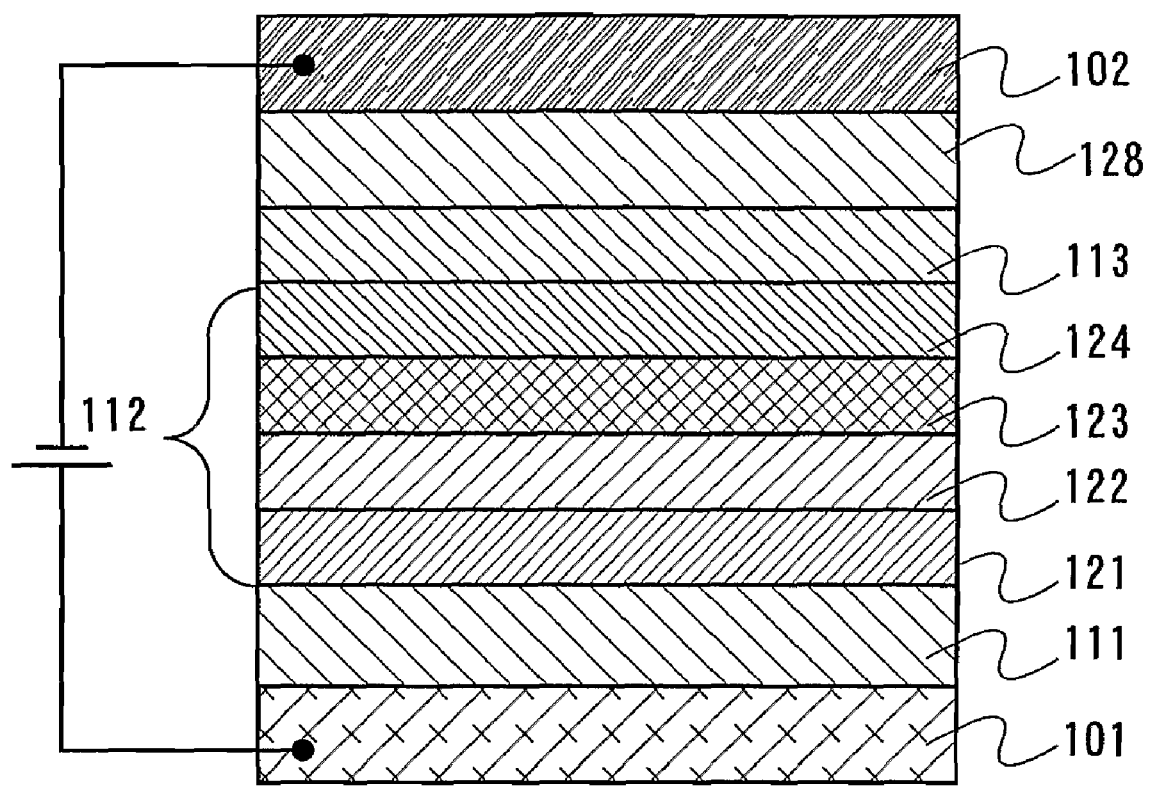
FIG. 15 shows a light-emitting element according, to an aspect of the present invention.

As shown in FIG. 15, a light-emitting element shown in this embodiment mode includes the first electrode 101 and the second electrode 102 that are opposed to each other, and the first layer 111, the second layer 112, the third layer 113 and a fourth layer 128 that are sequentially stacked over the first electrode 101. One feature of the light-emitting element is to have the fourth layer 128. The fourth layer 128 can be formed with the same material as that of the first layer 111. Other structures are the same as those of Embodiment Mode 1 and thus, the description thereof is omitted.

When the fourth layer 128 is provided, damages to underlayers in forming the second electrode 102 can be reduced.

The thickness of the fourth layer 128 is made different depending on each light-emitting element emitting each emission color. Consequently, the decrease of the light-extraction efficiency can be prevented. In addition, when the thickness is made different, a metal oxide such as molybdenum oxide, vanadium oxide or rhenium oxide may be used as the fourth layer 128. Also, a nitride or an oxynitride of these metals may be employed. This is because the driving voltage is not needed to be increased, even when the thickness is made larger using such metal oxides.

Damages to underlayers in forming the second electrode 102 can be expected to be more reduced by making the fourth layer 128 thicker.

The thickness of the first layer 111 can be made different depending on each light-emitting element emitting each emission color, as well as the fourth layer 128. Consequently, the thickness of the light-emitting element can be made more increased and defects in manufacturing can be reduced by making thicknesses of plural layers different, in addition to prevention of decrease in the light-extraction efficiency. The metal oxide described above, such as molybdenum oxide, vanadium oxide or rhenium oxide, is used for the first layer 111, which does not increase the driving voltage.

The present invention in which the thickness of a layer is made different depending on each light-emitting element emitting each emission color can be applied without limitations on a structure of a light-emitting element. As a result, decrease in the light-extraction efficiency can be prevented and the thickness of a light-emitting element can be increased. Further, the driving voltage is not made higher as the result of using a metal oxide or the like for the layer to be made thicker, which is preferable.

Embodiment Mode 3

Embodiment Mode 3 describes a structure in which the thickness of any of layers is made different in a light-emitting device including a color filter.

Figure 16:
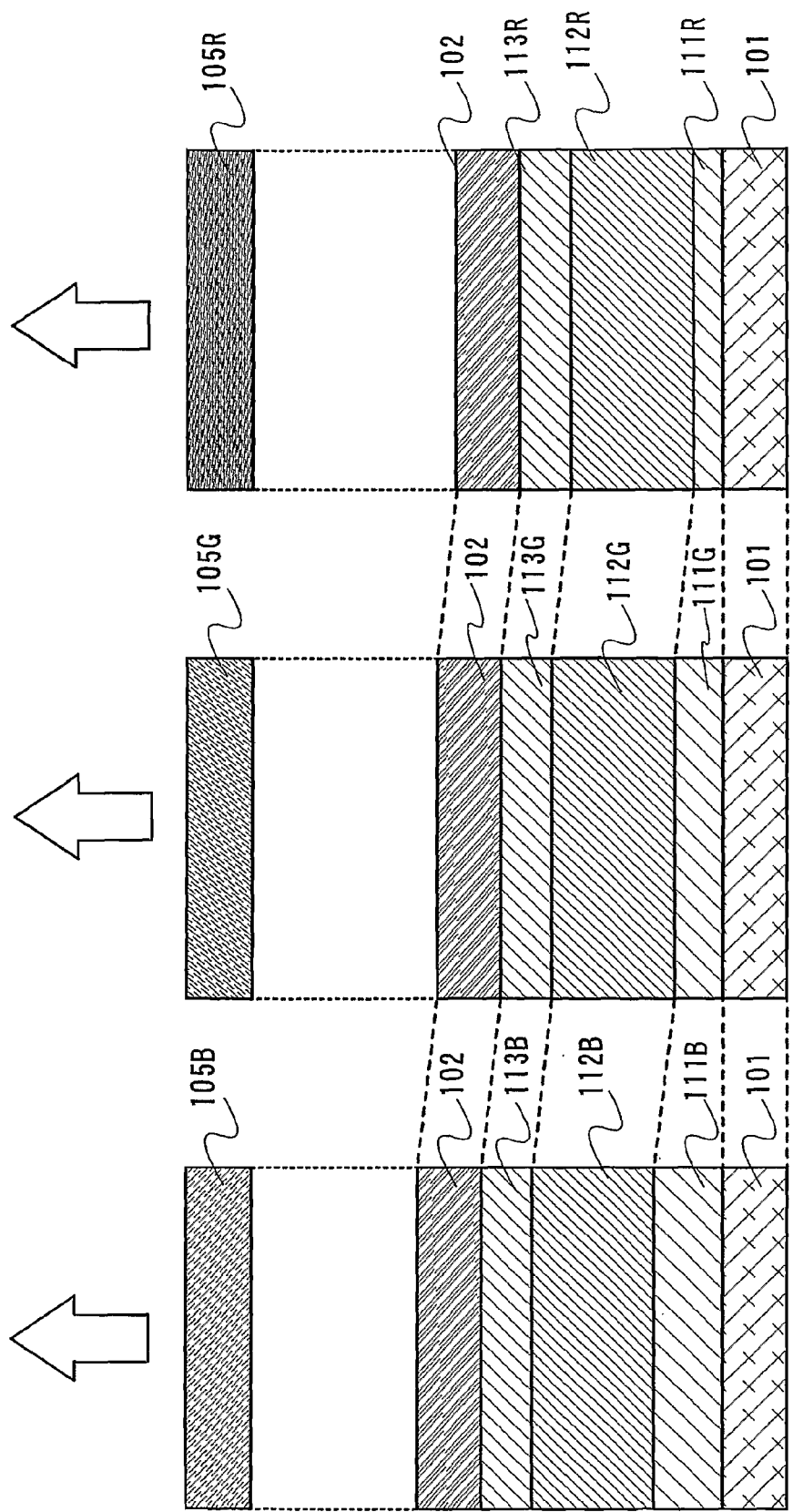
FIG. 16 shows a light-emitting element according to an aspect of the present invention.

As shown in FIG. 16, color filters 115R, 115G and 115B are provided in regions that are to exhibit red (R), green (G) and blue (B) that are different in optical characteristics, respectively. The color filters can be formed using a known material by a screen printing method, a droplet discharging method or the like. FIG. 16 shows the case where the color filters 105R, 105G and 105B are provided on the second electrode side 102 (on the emission side), and in this case, the second electrode 102 needs to be light-transmitting.

The structure of the light-emitting element is as follows: the first layers 111R, 111G and 111B, the second layers 112R, 112G, and 112B, the third layers 113R, 113G and 113B, and the second electrode 102 are formed sequentially over the first electrode 101. Since each color is generated by the color filters, the first to third layers are formed using the same material. However, in FIG. 16, the first to third layers are denoted by the first layers 111R, 111G and 111B, the second layers 112R, 112G and 112B, the third layers 113R, 113G and 113B in order to correspond to each color filter.

The thickness of any of the first to third layers is made different depending on each color filter. In FIG. 16, the thickness of the second layers 112R, 112G and 112B is different depending on each color filter.

According to this structure, it is possible to prevent decrease of the light-extraction efficiency due to the differences in light paths when light is recognized directly through the second electrode 102 and when light is recognized by passing through the second electrode 102 after it is reflected on the first electrode 101.

Specifically, when light enters the first electrode 101, phase reversal is generated in the reflected light, thereby generating the effect of interference of light for reflected light and direct light. At this time, in the case where an optical distance between the light-emitting layer and the reflective electrode (i.e., refractive index×distance) is (2 m−1)/4-fold (m is a given positive integer) of the emission wavelength, or, in the case where the optical distance is ¼, ¾, 5/4 . . . fold of the emission wavelength, the light extraction efficiency is increased. In the meanwhile, in the case where the optical distance is m/2 times (m is a given positive integer), or, ½, 1, 3/2 . . . -fold of the emission wavelength, the light-extraction efficiency is reduced.

Therefore, in the light-emitting element of the present invention, the thickness of any of the first to third layers is made different depending on each color filter so that the optical distance between the layer in which electrons and holes are recombined (i.e., light-emitting layer) and the reflective electrode, in other words, refractive index×distance, is (2 m−1)/4-fold (m is a given positive integer) of the emission wavelength.

Specifically, in the first to third layers, the thickness of a layer between the layer in which electrons and holes are recombined and the first electrode 101 serving as the reflective electrode, may be made different. However, without being limited to this structure, the thickness of a layer between the layer in which electrons and holes are recombined and the second electrode 102 serving as the light-transmitting electrode may be made different. Alternatively, the thicknesses of the both layers may be made different. Consequently, light can be extracted outside efficiently.

Specifically, when the first to third layers are formed by an evaporation method using an evaporation mask, and the thickness of at least one of the layers is made different, the same evaporation mask can be used, which is preferable. On the other hand, as described in Reference 1, a photolithography process and an etching process are needed to make the thickness of an electrode different, and thus the number of processes is increased.

In this manner, according to the present invention, the decrease of the light-extraction efficiency can be prevented without increasing the number of processes.

A layer is needed to be thicker because any of the first to third layers is made different. Thus, one feature of the present invention is that a layer in which an organic compound and a metal oxide that is an inorganic compound are mixed is used as the layer to be made thicker.

Commonly, when the thickness of a layer in the light-emitting element becomes large, the driving voltage also increases, which is not preferable. However, as described in Embodiments below, the present inventors have found that the driving voltage itself can be lowered by using a layer in which an organic compound and a metal oxide that is an inorganic compound are mixed is used as a layer to be made thicker, without increasing the driving voltage, even when the layer is made thicker.

By making any of the first to third layers thicker, a short circuit between the first electrode 101 and second electrode 102 can be prevented, and productivity can be enhanced, which is preferable.

Figure 17:
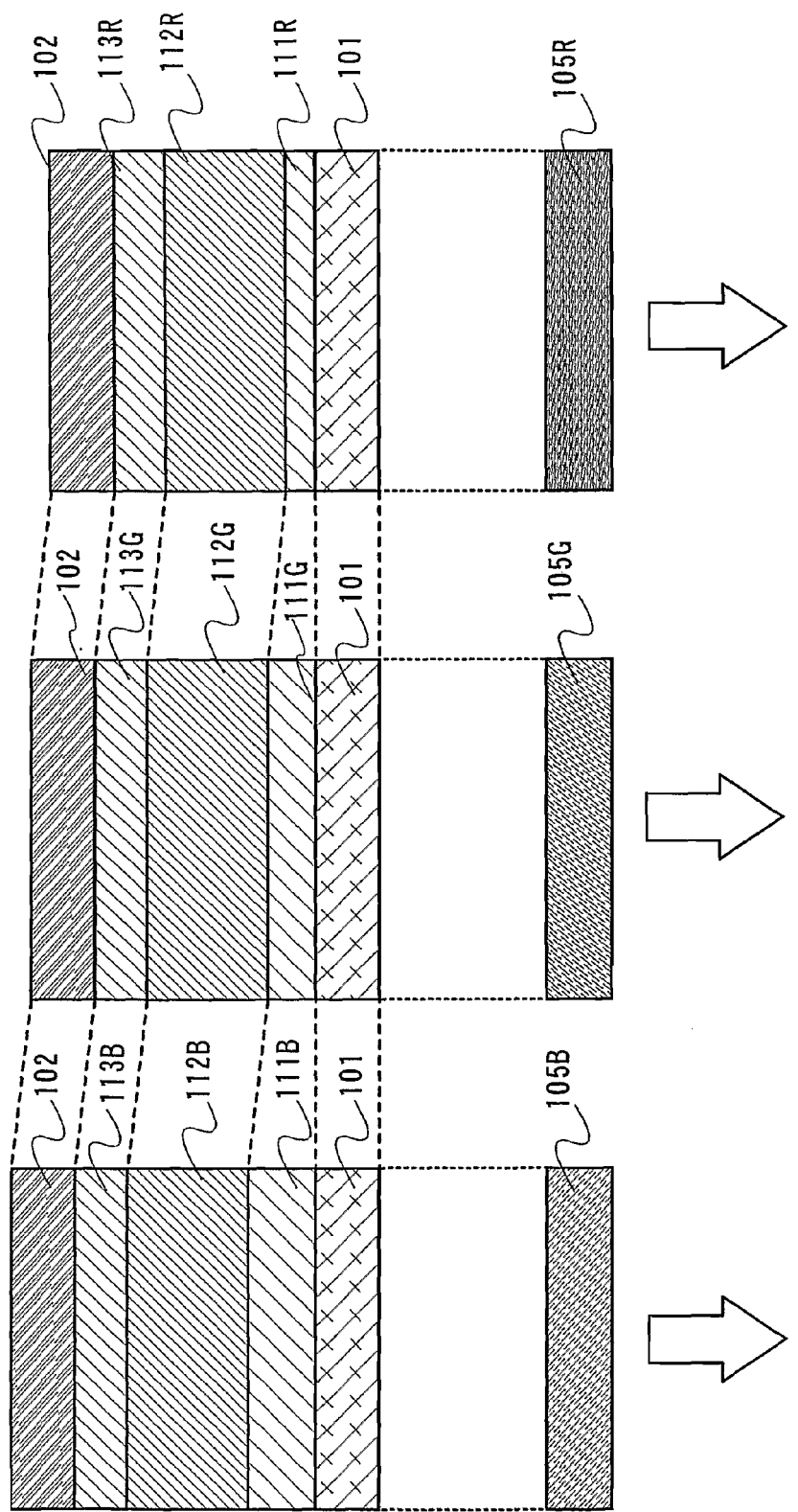
FIG. 17 shows a light-emitting element according to an aspect of the present invention.

FIG. 17 shows a case where color filters are provided on the first electrode side (on the emission side), which is different from that in FIG. 16. Other structures are similar to those in FIG. 16, and thus, the description thereof is omitted. In the case where the color filters are provided on the first electrode side as shown in FIG. 17, a plurality of insulating films and the like constituting a part of a thin film transistor are stacked below the first electrode. Thus, it is preferable that the thickness of each layer is made different in consideration of light reflected by such insulating films and the like. Further, the insulating films and the like may be removed in a region through which light passes.

The present invention as shown in FIG. 16 or 17 has one feature that the thickness of at least one of the first to third layers is made different depending on each color filter. At this time, the thickness of a layer between the layer in which electrons and holes are recombined (i.e., light-emitting layer) and the reflective electrode is preferably made different depending on each color filter. Further, it is preferable that a layer in which an organic compound and a metal oxide that is an inorganic compound are mixed is used as the layer to be made thicker, since a driving voltage does not become high.

Embodiment Mode 4

Embodiment Mode 4 specifically describes a cross-sectional structure of a pixel including a color filter and a light-emitting element. A cross-sectional structure of a pixel in the case where a transistor for controlling current supplied to a light-emitting element (driving transistor) is a p-channel thin film transistor (TFT) is described with reference to FIG. 18. This embodiment mode describes the case where the light-emitting element has two electrodes, namely, the first electrode 101 and the second electrode 102, and one of the first electrode 101 and the second electrode 102 whose potential can be controlled by a transistor is an anode and the other is a cathode.

Figure 18:
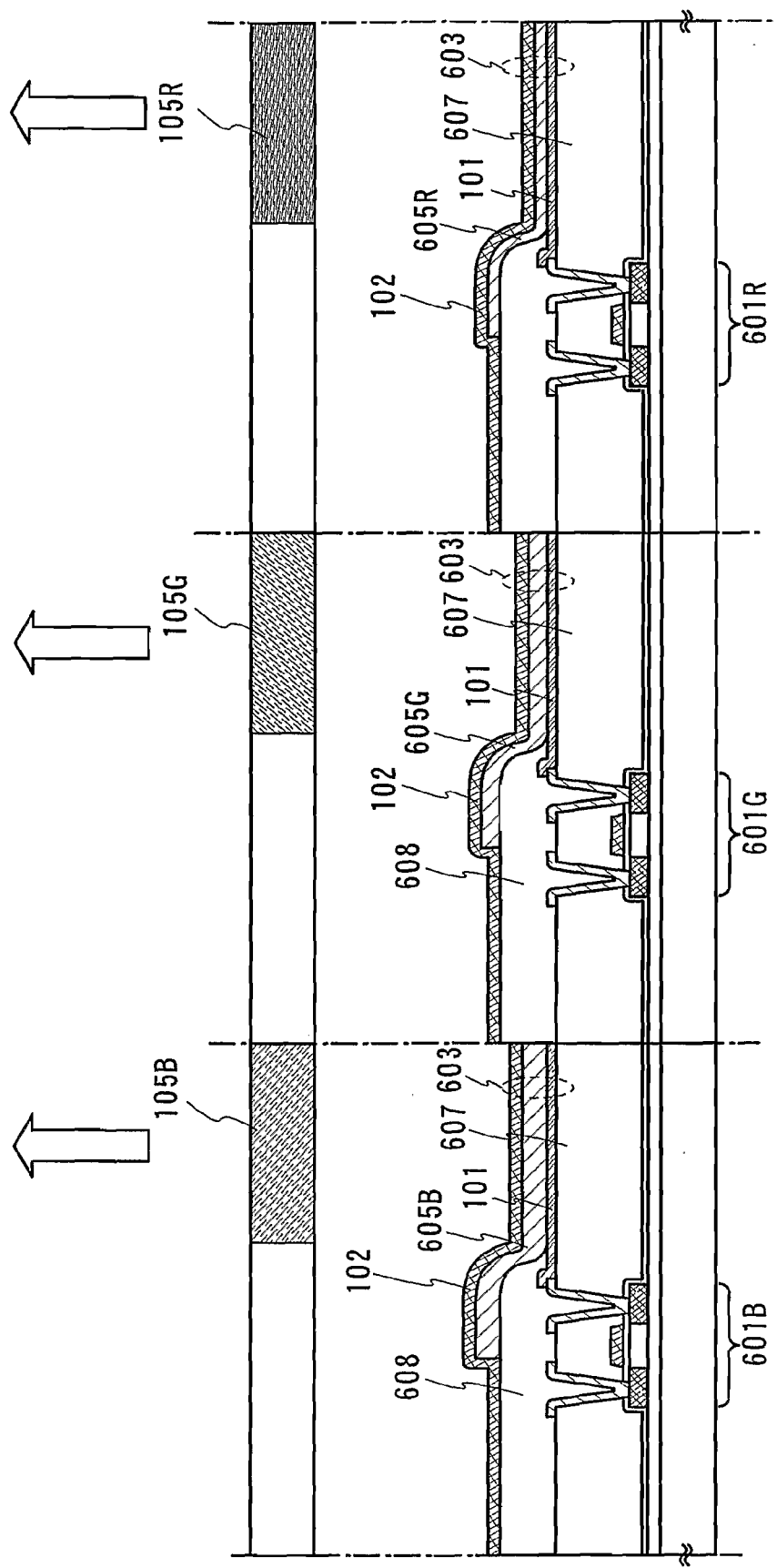
FIG. 18 is a cross-sectional view showing a light-emitting element according to an aspect of the present invention.

FIG. 18 is a cross-sectional view of a pixel including color filters 105R, 105G and 105B, in the case of a top emission type in which TFTs 601R, 601G and 601B are each p-channel type and light generated in a light-emitting element 603 is extracted through the second electrode 102. In FIG. 18, the first electrode 101 of the light-emitting element 603 is electrically connected to the TFTs 601R, 601G and 601B.

The TFTs 601R, 601G and 601B are 10 to 200 nm thick, and their channel forming regions are formed with island-like semiconductor films. Any of an amorphous semiconductor film, a crystalline semiconductor film, and a microcrystalline semiconductor film may be used as the semiconductor film. For example, in the case of forming an amorphous semiconductor film, the amorphous semiconductor film is formed first and is heated to be crystallized by a heat treatment to form a crystalline semiconductor film. The heat treatment can be conducted using a heating furnace, laser irradiation, light-irradiation from a lamp instead of laser light (hereinafter, lamp annealing), or a combination thereof.

In the case of laser irradiation, a continuous wave (CW) laser or a pulsed laser may be used.

The laser irradiation may be conducted so that the incident angle θ of laser light with respect to a semiconductor film is 0°<θ<90°. Consequently, an interference of laser light can be prevented.

The semiconductor film may be irradiated with continuous wave laser light of a fundamental wave and continuous wave laser light of a harmonic, or may be irradiated with continuous wave laser light of a fundamental wave and pulsed wave laser light of a harmonic. Energy can be supplemented by irradiating with plural kinds of laser light.

In the case of the pulsed laser, a pulsed laser may be oscillated with such a repetition rate that the laser of the next pulse is emitted before solidifying the semiconductor film that has been melted. This makes it possible to obtain crystal grains which are sequentially grown in the scanning direction. In other words, it is possible to use a pulsed beam with a lower limit of a repetition rate that is set shorter than the time required for the melted semiconductor film to solidify. The pulsed beam that can be used actually is a repetition rate of 10 MHz or more. This repetition rate is extremely higher than that of the pulsed laser used usually, which is from several tens to several hundred Hz, to conduct laser crystallization.

In the case of using a heating furnace for another heat treatment, an amorphous semiconductor film is heated at a temperature of 500 to 550° C. for 2 to 20 hours. At this time, the temperature may be set in multiple stages in the range of 500 to 550° C. so as to gradually reach a higher temperature. This is because so-called dehydrogenation can be performed to reduce film roughness during crystallization, since hydrogen and the like of the amorphous semiconductor film are released in the first low temperature heating process. When a metal element for promoting crystallization, for example, Ni, is further formed over the amorphous semiconductor film, the heat temperature can be lowered, which is preferable. Even in the case of crystallization using such a metal element, a heat treatment may be performed at a temperature of 600 to 950° C.

However, in the case of forming a metal element, there is a concern that the metal element may adversely affect electric characteristics of a semiconductor element. Thus, a gettering process is required to reduce or remove the metal element. For example, a process of gettering the metal element may be performed using the amorphous semiconductor film as a gettering sink.

In the TFTs 601R, 601G and 601B, a gate insulating film covering the semiconductor film, a gate electrode in which a fist conductive film and a second conductive film are stacked, an insulating film over the gate electrode are provided.

The TFTs 601R, 601G and 601B are each p-channel type, and the semiconductor film has a single drain structure having only a high concentration impurity region. Alternatively, the TFTs 601R, 601G and 601B may have an LDD (lightly doped drain) structure in which a low concentration impurity region and a high concentration impurity region are provided in the semiconductor film.

The TFTs 601R, 601G and 601B are covered with an interlayer insulating film 607, and a bank 608 having an opening portion is formed over the interlayer insulating film 607. The first electrode 101 is partially exposed in the opening portion of the bank 608, and the first electrode 101, electroluminescent layers 605R, 605G and 605B, and the second electrode 102 are sequentially stacked in the opening portion. The electroluminescent layers can be formed using the same material; however, the electroluminescent layers are denoted by the electroluminescent layers 605R, 605G and 605B so as to correspond to each color filter in the drawing.

The electroluminescent layers 605R, 605G and 605B correspond to the first to third layers 111, 112 and 113, and the thickness of any of the first to third layers is made different depending on each color filter. In this embodiment mode, the relationship between the thicknesses of the electroluminescent layers becomes 605R<605G<605B. This embodiment mode shows a top emission type, and thus, the thickness of the first layers closest to the first electrode 101 may be different depending on each color filter. As a result, decrease in the light-extraction efficiency can be prevented. Preferably, increase in driving voltage due to a thicker thickness can be prevented by using a layer in which an organic compound and a metal oxide are mixed as the first layer.

Since the top emission type is shown in this embodiment mode, the first electrode 101 is formed using a non-light-transmitting material, in other words, highly reflective material. The concrete materials thereof are shown in embodiment modes described above.

The second electrode 102 is preferably formed using a light-transmitting material, more preferably, a substance having a high work function. The concrete materials thereof are shown in embodiment modes described above.

In addition, since the transistor for controlling supply is p-channel type, a wiring connected to the TFTs 601R, 601G and 601B can be used as the first electrode 101.

The first electrode 101 or the second electrode 102 can be formed by a sputtering method, an evaporation method or the like.

The interlayer insulating film 607 is formed using an organic resin material, an inorganic insulating material, or an insulator including Si—O—Si bond, which is formed from a siloxane based material. Siloxane based insulator has a skeleton formed by the bond of silicon (Si) and oxygen (O), in which a compound containing at least hydrogen (such as an alkyl group or aromatic hydrocarbon) is included as a substituent. Further, a fluoro group may be used as a substituent. In addition, a compound containing at least hydrogen and a fluoro group may be used as a substituent. Moreover, a material referred to as a low dielectric constant material (low-k material) may be used for the interlayer insulating film 607.

The bank 608 can be formed using an organic resin material, an inorganic insulating material or a siloxane based insulator. For example, acrylic, polyimide, polyamide and the like can be used as the organic resin material, and silicon oxide, silicon nitride oxide and the like can be used as the inorganic insulating material. In particular, a photosensitive organic resin material is used for the bank 608, an opening portion is formed over the first electrode 101 so that the side of the opening portion has an inclined plane with a continuous curvature. As a result, a short circuit between the first electrode 101 and the second electrode 102 can be prevented.

In such a pixel, light emitted from the light-emitting element 603 can be extracted through the second electrode 102 as shown by the outline arrow.

Figure 19:
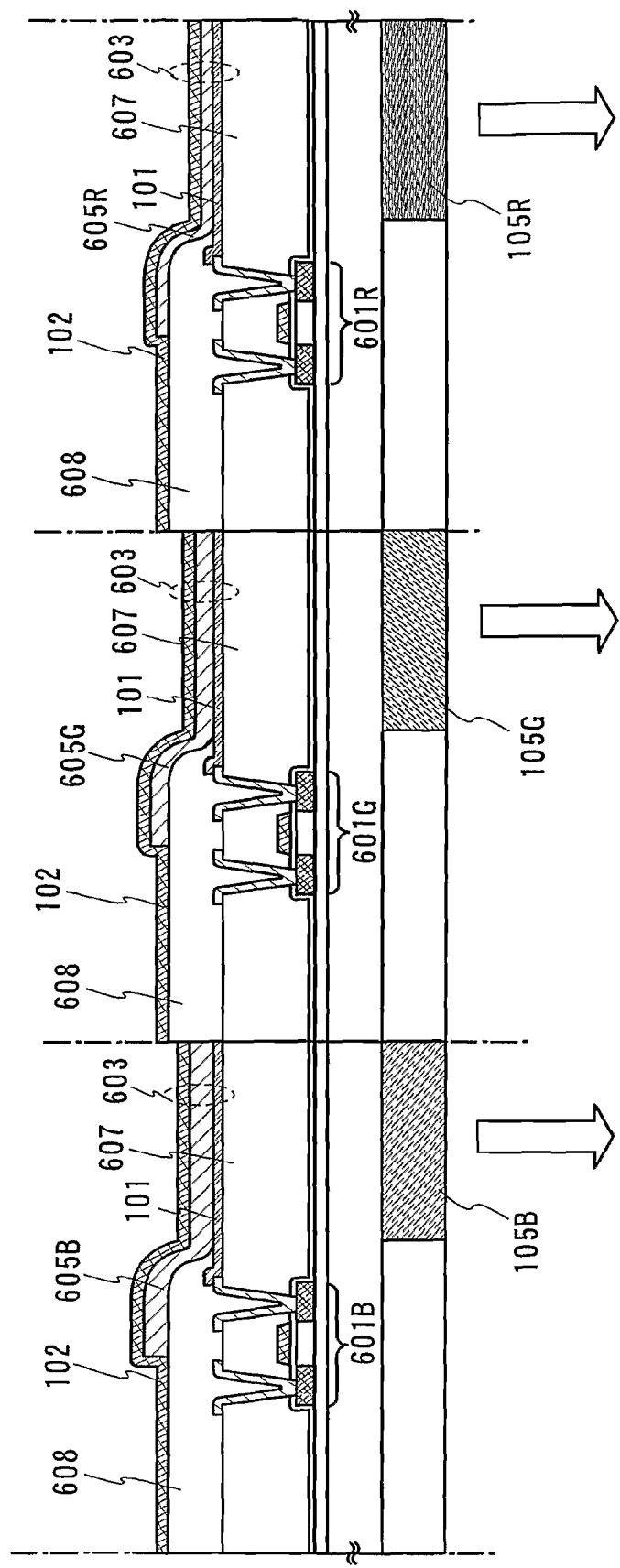
FIG. 19 is a cross-sectional view showing a light-emitting element according to an aspect of the present invention.

Next, FIG. 19 is a cross-sectional view of a pixel in the case of a bottom emission type in which TFTs 601R, 601G and 601B are each p-channel type and light generated in a light-emitting element 603 is extracted through the second electrode 102.

In FIG. 19, the first electrode 101 of the light-emitting element 603 is electrically connected to the TFTs 601R, 601G and 601B. In addition, electroluminescent layers 605R, 605G and 605B, and the second electrode 102 are sequentially stacked over the first electrode 101.

The TFTs 601R, 601G and 601B can be formed in the same manner as in FIG. 18. In addition, since the bottom emission type is shown in FIG. 19, the first electrode 101 has a light-transmitting property and the second electrode 102 has a non-light-transmitting property. Materials of the electrodes can be referred to the description of the first electrode and the second electrode in FIG. 18. Color filters 105R, 105G and 105B are provided on the substrate side (on the emission side). For example, the color filters 105R, 105G and 105B can be provided for a rear face of the substrate (i.e., a surface in which TFTs are not formed).

The electroluminescent layers 605R, 605G and 605B can be formed in the same manner as the electroluminescent layers shown in FIG. 18, and the thickness of at least one of the first to third layers is different depending on each color filter. Since the bottom emission type is shown in FIG. 19, the thickness of the third layer closest to the second electrode 102 may be made different depending on each color filter. In this embodiment mode, the relationship between the thicknesses of the electroluminescent layers is 605R<605G<605B. Consequently, decrease in the light-extraction efficiency can be prevented. Preferably, a layer in which an organic compound and a metal oxide are mixed is used as the third layer, thereby preventing the increase of the driving voltage due to the thicker thickness.

In the pixel shown in FIG. 19, light emitted from the light-emitting element 613 can be extracted through the second electrode 102 as shown by the outline arrow, and the color filters 105R, 105G and 105B are provided on the emission side.

This embodiment mode can be freely combined with the embodiment modes described above.

Embodiment Mode 5

Embodiment Mode 5 specifically describes a cross-sectional structure of a pixel having a color filter and a light-emitting element, in the case where a transistor for controlling current supplied to a light-emitting element (driving transistor) is an n-channel thin film transistor (TFT). This embodiment mode describes the case where the light-emitting element has two electrodes, namely, the first electrode is an anode and the second electrode is a cathode.

Figure 20:
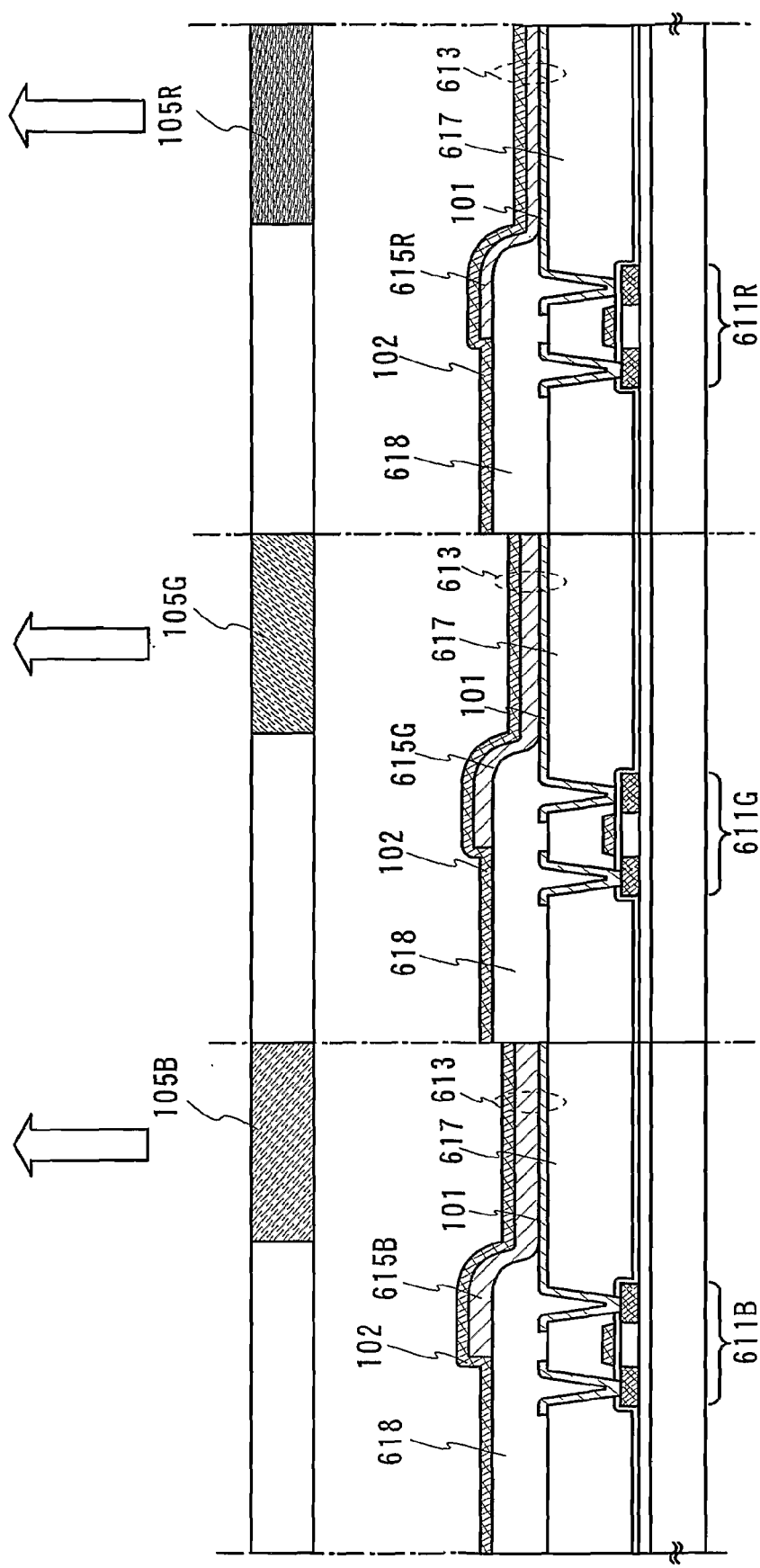
FIG. 20 is a cross-sectional view showing a light-emitting element according to an aspect of the present invention.

Next, FIG. 20 is a cross-sectional view of a pixel in the case of a top emission type in which TFTs 611R, 611G and 611B are each n-channel type and light generated in a light-emitting element 613 is extracted through the second electrode 102. In FIG. 20, the first electrode 101 of the light-emitting element 613 is electrically connected to the TFTs 611R, 611G and 611B. In addition, electroluminescent layers 615R, 615G and 615B, and the second electrode 102 are sequentially stacked over the first electrode 101.

The TFTs 611R, 611G and 611B can be formed in the same manner as TFTs 601R, 601G and 601B in the embodiment mode described above.

Since the top emission type is shown in FIG. 20, the first electrode 101 is formed using a non-light-transmitting material and the second electrode 102 is formed using a light-transmitting material. The materials can be referred to the embodiment modes described above. In addition, since the transistor for controlling supply is n-channel type, a wiring connected to the TFTs 611R, 611G and 611B can be used as the first electrode 101. The color filters 105R, 105G and 105B are provided on the second electrode 102 side. And the second electrode has a light-transmitting property.

The electroluminescent layers 615R, 615G and 615B can be formed in the same manner as the electroluminescent layers 605R, 605G and 605B in the embodiment mode described above. The hole injecting layer, the hole transporting layer, the light-emitting layer, the electron transporting layer and the electron injecting layer are stacked in this order on the first electrode 101, since the first electrode 101 is an anode, when the electroluminescent layer 615 has, in addition to the light-emitting layer, any of the following: the hole injecting layer, the hole transporting layer, the electron transporting layer and the electron injecting layer.

The electroluminescent layers 615R, 615G and 615B correspond to the first to third layers 111, 112 and 113, and the thickness of any of the first to third layers is made different depending on each color filter. Since the top emission type is shown in this embodiment mode, the thickness of the first layer closest to the first electrode 101 may be made different depending on each color filter. In this embodiment mode, the relationship between the thicknesses of the electroluminescent layers is 615R<615G<615B. Consequently, decrease in the light-extraction efficiency can be prevented. Preferably, a layer in which an organic compound and a metal oxide are mixed is used as the first layer, thereby preventing the increase of the driving voltage due to the thicker thickness.

In the pixel shown in FIG. 20, light emitted from the light-emitting element 613 can be extracted through the second electrode 102 as shown by the outline arrow, and the color filters 105R, 105G and 105B are provided on the emission side.

Figure 21:
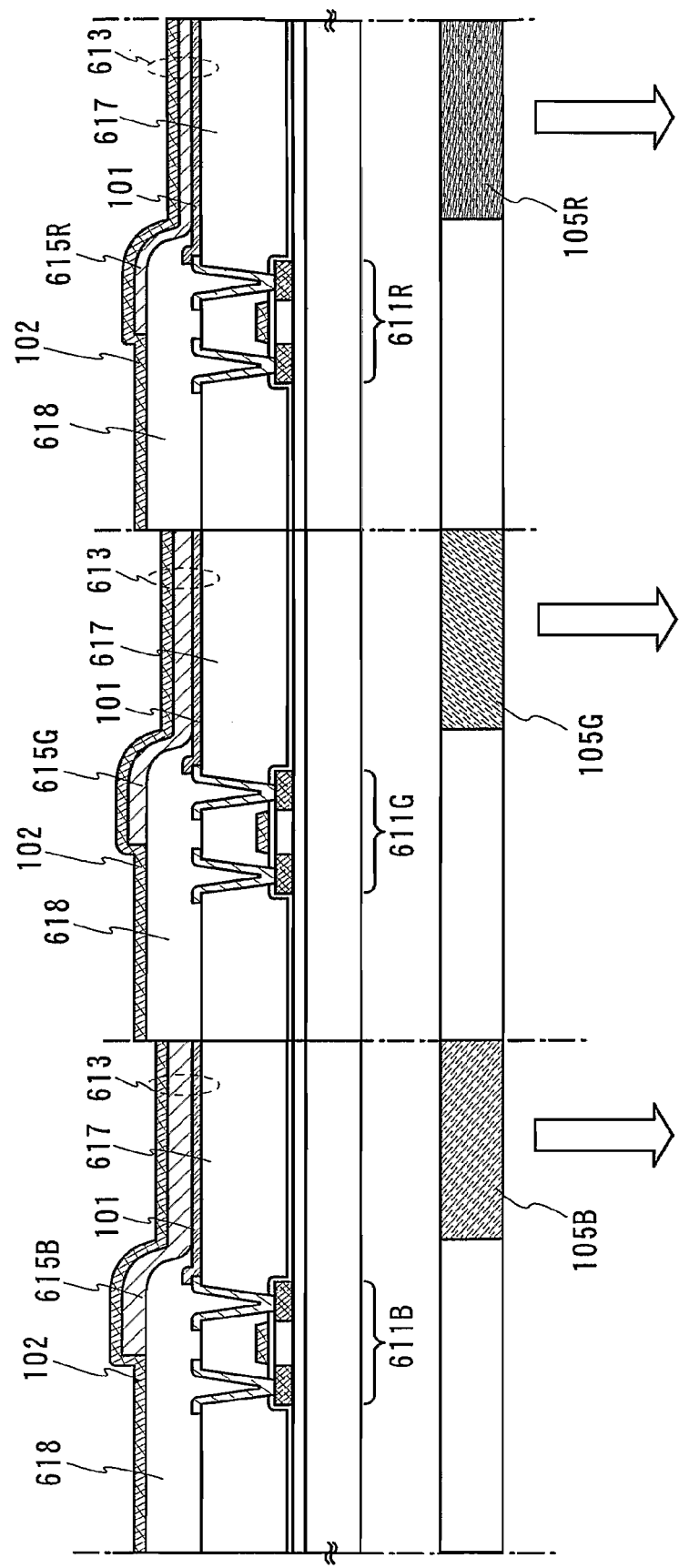
FIG. 21 is a cross-sectional view showing a light-emitting element according to an aspect of the present invention.

Next, FIG. 21 is a cross-sectional view of a pixel having each emission color (RGB), in the case of a bottom emission type in which TFTs 611R, 611G and 611B are each n-channel type and light generated in a light-emitting element 613 is extracted through the first electrode 101.

In FIG. 21, the first electrode 101 of the light-emitting element 613 is electrically connected to the TFTs 611R, 611G and 611B. In addition, electroluminescent layers 615R, 615G and 615B, and the second electrode 102 are sequentially stacked over the first electrode 101.

The TFTs 611R, 611G and 611B can be formed in the same manner as in the embodiment mode described above. In addition, since the bottom emission type is shown in FIG. 21, the first electrode 101 has a light-transmitting property and the second electrode 102 has a non-light-transmitting property. The materials thereof can be referred to the embodiment modes described above. Further, the color filters 105R, 105G and 105B are provided on the first electrode 101 side. And the first electrode 101 has a light-transmitting property.

The electroluminescent layers 615R, 615G and 615B can also be formed in the same manner as in the embodiment modes described above and the thickness of any of the first to third layers is made different depending on each color filter. Note that the hole injecting layer, the hole transporting layer, the light-emitting layer, the electron transporting layer and the electron injecting layer are stacked in this order on the first electrode 101, since the first electrode 101 is an anode, when the electroluminescent layer 615 has, in addition to the light-emitting layer, any of the following: the hole injecting layer, the hole transporting layer, the electron transporting layer and the electron injecting layer.

Since the bottom emission type is shown in FIG. 21, the thickness of the third layer closest to the second electrode 102 is made different depending on each color filter. In this embodiment mode, the relationship between the thicknesses of the electroluminescent layers is 615R<615G<615B. Consequently, decrease in the light-extraction efficiency can be prevented. Preferably, a layer in which an organic compound and a metal oxide are mixed is used as the third layer, thereby preventing the increase of the driving voltage due to the thicker thickness.

In the pixel shown in FIG. 21, light emitted from the light-emitting element 613 can be extracted through the first electrode 101 as shown by the outline arrow, and the color filters 105R, 105G and 105B are provided on the emission side.

This embodiment mode can be freely combined with the embodiment modes described above.

Embodiment Mode 6

Embodiment Mode 6 describes materials of the first to third layers and the electrodes.

The first layer 111 is a layer generating holes. As the first layer 111, for example, a layer containing a substance having hole transporting property and a substance having electron accepting property with respect to the substance having hole transporting property (in other words, the substance serving as an acceptor for the substance having hole transporting property) can be given. The substance having electron accepting property with respect to the substance having hole transporting property is preferably included so as to satisfy a molar ratio (i.e., the substance having electron accepting property with respect to the substance having hole transporting property/the substance having hole transporting property) of 0.5 to 2.

The substance having hole transporting property indicates a substance having a strong property of transporting holes rather than electrons. An organic compound, for example, an aromatic amine compound such as 4,4'-bis[N-(1-naphthyl)-N-phenylamino]biphenyl (α-NPD), 4,4'-bis[N-(3-methylphenyl)-N-phenylamino]biphenyl (TPD), 4,4',4"-tris(N,N-diphenylamino)triphenylamine (TDATA), 4,4',4"-tris[N-(3-methylphenyl)-N-phenylamino]triphenylamine (MTDATA), and 4,4'-bis{N-[4-(N,N-di-m-tolylamino)phenyl]-N-phenylamino}biphenyl (DNTPD); a phthalocyanine compound such as phthalocyanine ($H_2Pc$), copper phthalocyanine (CuPc) and vanadyl phthalocyanine (VOPc) can be used. Also, as the substance having hole transporting property, for example, a carbazole derivative such as 4,4'-di(N-carbazolyl)biphenyl (CBP) or an aromatic hydrocarbon compound such as 9,10-di(2-naphthyl)-2-tert-butylanthracene (t-BuDNA) can be applied. Note that the substance having hole transporting property is not limited to these materials.

As the substance having electron accepting property with respect to the substance having hole transporting property, for example, a metal oxide such as molybdenum oxide, vanadium oxide, or ruthenium oxide can be used. Further, a nitride or an oxynitride of the metals may be employed. The substance having electron accepting property with respect to the substance having hole transporting property is not limited thereto.

The first layer 111 in which the substance having hole transporting property and the substance having electron accepting property with respect to the substance having hole transporting property are mixed can be formed by a co-evaporation method. Specifically, the first layer 111 can be formed by combining the same methods or different methods, for example, a co-evaporation method using resistance heating evaporation, a co-evaporation method using electron beam evaporation, a co-evaporation method using resistance heating evaporation and electron beam evaporation, a formation method using resistance heating evaporation and sputtering, a formation method using electron beam evaporation and sputtering, and the like. In addition, the above described examples are given in consideration of forming a layer including two types of materials; however, a layer including three or more types of materials can also be formed by combining the same methods or different methods as well.

The first layer 111 may include another organic compound, for example, rubrene. Reliability can be enhanced by adding rubrene.

In addition, the first layer 111 may be a layer including a metal oxide such as molybdenum oxide, vanadium oxide, ruthenium oxide, cobalt oxide or copper oxide. In addition, a nitride or an oxynitride of the metals may be employed.

However, it is preferable that the first layer 111 is formed with the layer containing an organic compound and a metal oxide as described above, since the conductivity can be enhanced at this time. When the conductivity is high, the first layer 111 can be made thicker.

The second layer 112 is a layer including a light-emitting layer. The second layer 112 may have a single layer structure or a multilayer structure. For example, as shown in FIG. 1, the second layer 112 may have a multilayer structure including a hole transporting layer 121, an electron transporting layer 123, and an electron injecting layer 124, in addition to the light-emitting layer 122, or a single layer of the light-emitting layer 122. Note that the light-emitting substance is a substance that has a favorable light-emitting efficiency and can emit light of a desired emission wavelength.

The second layer 112 is preferably formed using a layer in which a light-emitting substance is dispersed in a layer of a substance having a larger energy gap than that of the light-emitting substance. However, the second layer is not limited thereto. Further, the energy gap indicates an energy gap between the LUMO level and the HOMO level. Note that the light-emitting substance may be a substance that has a favorable light-emitting efficiency and can emit light of a desired emission wavelength.

As a substance used for dispersing a light-emitting substance, for example, an anthracene derivative such as 9,10-di(2-naphthyl)-2-tert-butylanthracene (t-BuDNA); a carbazole derivative such as 4,4'-di(N-carbazolyl)biphenyl (CBP); a metal complex such as bis[2-(2-hydroxyphenyl)pyridinato] zinc ($Znpp_2$) and bis[2-(2-hydroxyphenyl)benzoxazolato] zinc (ZnBOX); and the like can be used. However, the substance used for dispersing a light-emitting substance is not particularly limited to these materials. Note that quenching of light emitted from the light-emitting substance due to the concentration of the light-emitting substance can be prevented by employing the structure.

In order to obtain red light emission, for example, the following substances can be employed: 4-dicyanomethylene-2-isopropyl-6-[2-(1,1,7,7-tetramethyljulolidine-9-yl)ethenyl]-4H-p yran (DCJTI); 4-dicyanomethylene-2-methyl-6-[2-(1,1,7,7-tetramethyljulolidine-9-yl)ethenyl]-4H-pyr an (DCJT); 4-dicyanomethylene-2-tert-butyl-6-[2-(1,1,7,7-tetramethyljulolidine-9-yl)ethenyl]-4H-p yran (DCJTB); periflanthene; 2,5-dicyano-1,4-bis[2-(10-methoxy-1,1,7,7-tetramethyljulolidine-9-yl)ethenyl]benzene; bis[2,3-bis(4-fluorophenyl) quinoxalinato]iridium (acetylacetonato) (Ir[$Fdpq]_2$(acac)) and the like. However, the present invention is not limited to these materials, and a substance that can emit light with a peak of emission spectrum in 600 to 680 nm, can be used.

In order to obtain green light emission, substances such as N,N'-dimethylquinacridon (DMQd), coumarin 6, coumarin 545T, and tris(8-quinolinolate)aluminum ($Alq_3$) can be employed. However, the present invention is not limited to these materials, and a substance that can emit light with a peak of emission spectrum in 500 to 550 nm can be used.

In order to obtain blue light emission, the following substances can be employed: 9,10-bis(2-naphthyl)-tert-butylanthracene (t-BuDNA); 9,9'-bianthryl; 9,10-diphenylanthracene (DPA); 9,10-bis(2-naphthyl)anthracene (DNA); bis(2-methyl-8-quinolinolate)-4-phenylphenolate-gallium (BGaq); bis(2-methyl-8-quinolinolate)-4-phenylphenolate-aluminum (BAlq); and the like. However, the present invention is not limited to these materials, and a substance that can emit light with a peak of emission spectrum in 420 to 500 nm can be used.

The third layer 113 is a layer generating electrons. As the third layer 113, for example, a layer including a substance having electron transporting property and a substance having electron donating property with respect to the substance having electron transporting property can be given. The substance having electron transporting property is a substance having a strong property of transporting electrons rather than holes. For example, a metal complex such as tris(8-quinolinolato)aluminum ($Alq_3$), tris(4-methyl-8-quinolinolato)aluminum ($Almq_3$), bis(10-hydroxybenzo[h]-quiuolinato)beryllium ($BeBq_2$), bis(2-methyl-8-quinolinolato)-4-phenylphenolate-aluminum (BAlq), bis[2-(2-hydroxyphenyl)benzoxazolate]zinc ($Zn(BOX)_2$), bis[2-(2-hydroxyphenyl)benzothiazolate]zinc ($Zn(BTZ)_2$) can be used. In addition, the following substances can be used as the substance having electron transporting property: 2-(4-biphenylyl)-5-(4-tert-butylphenyl)-1,3,4-oxadiazole (PBD); 1,3-bis[5-(p-tert-butylphenyl)-1,3,4-oxadiazole-2-yl]benzene (OXD-7); 3-(4-tert-butylphenyl)-4-phenyl-5-(4-biphenylyl)-1,2,4-triazole (TAZ); 3-(4-tert-butylphenyl)-4-(4-ethylphenyl)-5-(4-biphenylyl)-1,2,4-triazole (p-EtTAZ); bathophenanthroline (BPhen); bathocuproin (BCP); 4,4'-bis(5-methylbenzoxazolyl-2-yl)stilbene (BzOs) and the like. However, the substance having electron transporting property is not limited to these materials.

Further, an alkali metal such as lithium and cesium, alkaline earth metal such as magnesium and calcium, rare-earth metal such as erbium and ytterbium, and the like can be used as the substance having electron donating property with respect to the substance having electron transporting property. However, the substance having electron donating property with respect to the substance having electron transporting property is not limited thereto. Preferably, the third layer 113 includes the substance having electron donating property with respect to the substance having electron transporting property and the substance having electron transporting property so as to satisfy a molar ratio (i.e., the substance having electron donating property with respect to the substance having electron transporting property/the substance having electron transporting property) of 0.5 to 2.

Additionally, the third layer 113 may include a substance such as zinc oxide, zinc sulfide, zinc selenide, tin oxide and titanium oxide.

In the above-described light-emitting element, the difference in electron affinity between the substance having electron transporting property, which is included in the third layer 113 and a substance, which is included in a layer in contact with the third layer 113 among the layers included in the second layer 112, is preferably set to be 2 eV or less, more preferably, 1.5 eV or less. When the third layer 113 is made using an n-type semiconductor, the difference between a work function of the n-type semiconductor and the electron affinity of the substance, which is included in the layer in contact with the third layer 113 among the layers included in the second layer 112, is preferably 2 eV or less, more preferably, 1.5 eV or less.

Further, the layer in contact with the third layer 113 among the layers included in the second layer 112 corresponds to the electron injecting layer 124 in the case where the second layer 112 has a stacked structure.

The second layer 112 may have a single layer structure of a light-emitting layer or a structure without the electron injecting layer 124 or the like.

As just described, the second layer 112 and the second electrode 102 are joined by the third layer 113, and thus, electrons can be easily injected from the second electrode 102 into the second layer 112.

Then, the electrodes are described. One of the first electrode 101 and the second electrode 102 can transmit visible light and is formed using a conductive substance. Therefore, light can be extracted outside through one of the first electrode 101 and the second electrode 102 described above.

As materials for forming the first electrode 101, in addition to aluminum (Al) or a light-transmitting material such as indium tin oxide (ITO), indium tin oxide containing silicon oxide (hereinafter, also referred to as ITSO), or indium oxide containing zinc oxide of 2 to 20%, a metal material such as gold (Au), platinum (Pt), nickel (Ni), tungsten (W), chromium (Cr), molybdenum (Mo), iron (Fe), cobalt (Co), copper (Cu) or palladium (Pd), or a stacked structure of the metals can be used. For example, when the first electrode needs to have a light-transmitting property, the metal material is made thin to become semi-transparent and a transparent material is stacked thereover. Naturally, a single layer of a semi-transparent metal material may be used. However, the materials of the first electrode are not limited to these materials.

As materials for forming the second electrode 102, in addition to a light-transmitting material such as indium tin oxide (ITO), indium tin oxide containing silicon oxide (ITSO), or indium oxide containing zinc oxide of 2 to 20%, a metal material such as gold (Au), platinum (Pt), nickel (Ni), tungsten (W), chromium (Cr), molybdenum (Mo), iron (Fe), cobalt (Co), copper (Cu) or palladium (Pd), or a stacked structure of the metals can be used. For example, when the second electrode needs to have a light-transmitting property, the metal material is made thin to become semi-transparent, and a transparent material is stacked thereover. Naturally, a single layer of a semi-transparent metal material may be used. However, the materials of the second electrode are not limited to these materials.

The first electrode 101 or the second electrode 102 can be formed by a sputtering method, an evaporation method or the like.

As described above, the electron transporting layer 123 can be formed between the third layer 113 and the light-emitting layer 122. In this manner, the distance from the light-emitting layer 122 to the second electrode 102 or the third layer 113 can be increased by providing the electron transporting layer 123. Thus, quenching of light due to the metal can be prevented. The electron transporting layer 123 has a function of transporting injected electrons to the light-emitting layer 122.

The electron transporting layer 123 can be formed using the above-described $Alq_3$, $Almq_3$, $BeBq_2$, BAlq, $Zn(BOX)_2$, $Zn(BTZ)_2$, PBD, OXD-7, TAZ, p-EtTAZ, BPhen, BCP, or the like. Without being limited to these materials, the electron transporting layer 123 may be formed by using an substance having electron transporting property in which the electron mobility is higher than the hole mobility. Also, the electron transporting layer 123 is preferably farmed by using a substance having the electron mobility of $10^{-6}$ $cm^2/Vs$ or more. Further, the electron transporting layer 123 may have a multilayer structure formed by stacking two or more layers made from the above-described substances.

As shown in FIG. 1, the electron injecting layer 124 may be provided between the second electrode 102 and the electron transporting layer 123. The electron injecting layer 124 has a function of helping the injection of holes into the electron transporting layer 123 from the second electrode 102. In addition, since the third layer 113 exists, the electron injecting layer 124 is not necessarily provided. In other words, the third layer 113 can also have a function of helping electrons to be injected.

In this embodiment mode, the hole transporting layer 121 is provided between the first electrode 101 and the light-emitting layer 122 as shown in the embodiment mode described above. By providing the hole transporting layer 121, the distance from the light-emitting layer 122 to the first electrode 101 or the first layer 111 can be increased, and thus, quenching of light generated in the light-emitting layer due to the metal can be prevented. Note that the hole transporting layer 121 is a layer having a function of transporting holes injected from the first electrode 101 to the light-emitting layer 122.

The above-described α-NPD, TPD, TDATA, MTDATA, DNTPD and the like can be used for the hole transporting layer 121. However, the hole transporting layer 121 is not particularly limited thereto. The hole transporting layer 121 can be formed using the above-described substance with a hole transporting property of which the hole mobility is higher than the electron mobility. Specifically, the hole transporting layer 121 is preferably formed using a substance having the hole mobility of $10^{-6}$ cm$^2$/Vs or more. The hole transporting layer 121 may have a multilayer structure formed by stacking two or more layers including the above-described substances.

The hole transporting layer 121 can be formed using a metal oxide such as molybdenum oxide, vanadium oxide, ruthenium oxide, tungsten oxide or manganese oxide. In addition, the hole transporting layer 121 can be formed using the above-described phthalocyanine based compound such as $H_2Pc$, CuPC and VOPc, the aromatic amine compound such as DNTPD, or a high molecular weight material such as a poly(ethylenedioxythiophene)/poly(styrene sulfonate) mixture (PEDOT/PSS). Furthermore, the hole transporting layer 121 may be formed using the above-described layer including the substance with the hole transporting property and the substance having the electron accepting property with respect to the substance with the hole transporting property. However, the hole transporting layer 121 is not limited to these. In addition, the hole transporting layer 121 can also be served as the first layer 111.

Embodiment Mode 7

Embodiment Mode 7 specifically describes a cross-sectional structure of a pixel included in a light-emitting element. In this embodiment mode, a cross-sectional structure of a pixel in the case where a transistor for controlling current supplied to a light-emitting element (driving transistor) is a p-channel thin film transistor (TFT) is described using FIG. 3. Note that this embodiment mode describes a case where one of the first electrode 101 and the second electrode 102, whose potentials can each controlled by a transistor, is an anode and the other is a cathode.

Figure 3:
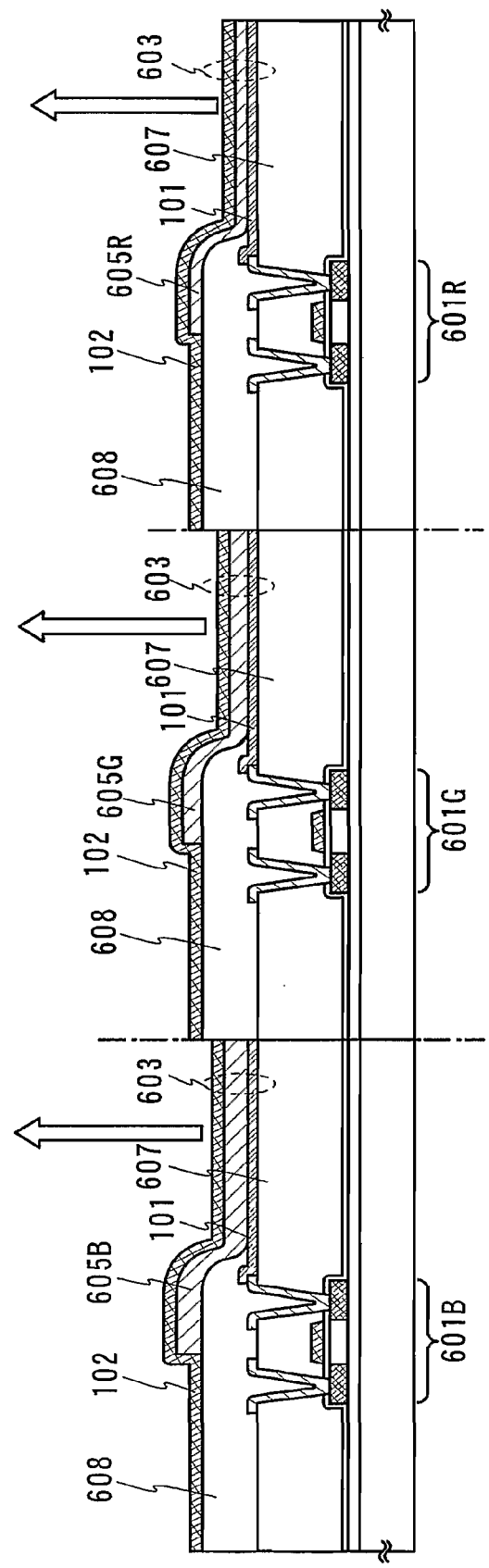
FIG. 3 shows a cross section of a pixel having a light-emitting element according an aspect of the present invention.

FIG. 3 is a cross-sectional view of a pixel having RGB, in the case of a top emission type in which TFTs 601R, 601G and 601B are each p-channel type and light generated in a light-emitting element 603 is extracted through the second electrode 102. In FIG. 3, the first electrode 101 of the light-emitting element 603 is electrically connected to the TFTs 601R, 601G and 601B.

The TFTs 601R, 601G and 601B are 10 to 200 nm thick, and channel forming regions are formed with island-like semiconductor films. Any of an amorphous semiconductor film, a crystalline semiconductor film, and a microcrystalline semiconductor film may be used as the semiconductor film as in the above-described embodiment mode. For example, in the case of forming an amorphous semiconductor film, the amorphous semiconductor film is formed first and is heated to be crystallized by a heat treatment to form a crystalline semiconductor film. The heat treatment can be conducted by a heating furnace, laser irradiation, lamp annealing, or a combination thereof.

In the case of laser irradiation, a continuous wave (CW) laser or a pulsed laser can be used.

Other crystallization conditions are the same as those in the above described embodiment mode.

Laser irradiation may be conducted so that the incident angle θ of laser light with respect to a semiconductor film is $0°<\theta<90°$. Consequently, an interference of laser light can be prevented.

The semiconductor film may be irradiated with continuous wave laser light of a fundamental wave and continuous wave laser light of a harmonic, or may be irradiated with continuous wave laser light of a fundamental wave and pulsed wave laser light of a harmonic. Energy can be supplemented by irradiating with plural kinds of laser light.

In the case of the pulsed laser, a pulsed laser may be oscillated with such a repetition rate that the laser of the next pulse is emitted before solidifying the semiconductor film that has been melted. This makes it possible to obtain crystal grains which are sequentially grown in the scanning direction. In other words, it is possible to use a pulsed beam with a lower limit of a repetition rate that is set shorter than the time required for the melted semiconductor film to solidify. The pulsed beam that can be used actually is a repetition rate of 10 MHz or more. This repetition rate is extremely higher than that of the pulsed laser used usually, which is from several tens to several hundred Hz, to conduct laser crystallization.

In the case of using a heating furnace for another heat treatment, an amorphous semiconductor film is heated at a temperature of 500 to 550° C. for 2 to 20 hours. At this time, the temperature may be set in multiple stages in the range of 500 to 550° C. so as to gradually reach a higher temperature. This is because so-called dehydrogenation can be performed to reduce film roughness during crystallization, since hydrogen and the like of the amorphous semiconductor film are released in the first low temperature heating process. When a metal element for promoting crystallization, for example, Ni, is further formed over the amorphous semiconductor film, the heat temperature can be lowered, which is preferable. Even in the case of crystallization using such a metal element, a heat treatment may be performed at a temperature of 600 to 950° C.

However, in the case of forming a metal element, there is a concern that the metal element may adversely affect electric characteristics of a semiconductor element. Thus, a gettering process is required to reduce or remove the metal element. For example, a process of gettering the metal element may be performed using the amorphous semiconductor film as a gettering sink.

In the TFTs 601R, 601G and 601B, a gate insulating film covering the semiconductor film, a gate electrode in which a fist conductive film and a second conductive film are stacked, an insulating film over the gate electrode are provided.

The TFTs 601R, 601G and 601B are each p-channel type, and the semiconductor film has a single drain structure having only a high concentration impurity region. Alternatively, the TFTs 601R, 601G and 601B may have an LDD (lightly doped drain) structure in which a low concentration impurity region and a high concentration impurity region are provided in the semiconductor film.

The TFTs 601R, 601G and 601B are covered with an interlayer insulating film 607, and a bank 608 having an opening portion is formed over the interlayer insulating film 607. The first electrode 101 is partially exposed in the opening portion of the bank 608, and the first electrode 101, electroluminescent layers 605R, 605G and 605B, and the second electrode 102 are sequentially stacked in the opening portion.

The electroluminescent layers 605R, 605G and 605B correspond to the first to third layers 111, 112 and 113, and the thickness of any of the first to third layers is made different depending on each emission color. This embodiment mode shows a top emission type, and thus, the thickness of the first layers closest to the first electrode 101 may be different depending on each emission color. As a result, decrease in the light-extraction efficiency can be prevented. Preferably, increase in driving voltage due to a thicker thickness can be prevented by using a layer in which an organic compound and a metal oxide are mixed as the first layer. Note that the thickness of the third layer can also be made different depending on each emission color.

Since the top emission type is shown in this embodiment mode, the first electrode 101 is formed using a non-light-transmitting material, in other words, highly reflective material. As the specific examples, metal materials such as aluminum (Al), gold (Au), platinum (Pt), nickel (Ni), tungsten (W), chromium (Cr), molybdenum (Mo), iron (Fe), cobalt (Co), copper (Cu) and palladium (Pd) can be given. Further, a stacked structure of light-transmitting materials such as indium tin oxide (ITO), indium tin oxide containing silicon oxide (ITSO), and indium oxide containing zinc oxide of 2 to 20% may be used. However, the material of the first electrode is not limited thereto.

The second electrode 102 is formed using a light-transmitting material and preferably, a substance having a high work function. Specifically, indium tin oxide (ITO), indium tin oxide containing silicon oxide (ITSO), and indium oxide containing zinc oxide of 2 to 20% can be used. In addition, gold (Au), platinum (Pt), nickel (Ni), tungsten (W), chrome (Cr), molybdenum (Mo), iron (Fe), cobalt (Co), copper (Cu), palladium (Pd) or the like, each of which is not light-transmitting, can be used by making them thin enough to transmit light. A stacked structure of these materials can also be used. However, the material of the second electrode is not limited thereto.

In addition, since the transistor for controlling supply is p-channel type, a wiring connected to the TFTs 601R, 601G and 601B can be used as the first electrode 101.

The first electrode 101 or the second electrode 102 can be formed by a sputtering method, an evaporation method or the like.

The interlayer insulating film 607 is formed using an organic resin material, or an inorganic insulating material, or a siloxane based insulator. Moreover, a material referred to as a low dielectric constant material (low-k material) may be used for the interlayer insulating film 607.

The bank 608 can be formed using an organic resin material, an inorganic insulating material or a siloxane based insulator. For example, acrylic, polyimide, polyamide and the like can be used as the organic resin material, and silicon oxide, silicon nitride oxide and the like can be used as the inorganic insulating material. In particular, a photosensitive organic resin material is used for the bank 608, an opening portion is formed over the first electrode 101 so that the side of the opening portion has an inclined plane with a continuous curvature. As a result, a short circuit between the first electrode 101 and the second electrode 102 can be prevented.

In such a pixel, light emitted from the light-emitting element 603 can be extracted through the second electrode 102 as shown by the outline arrow.

Figure 4:
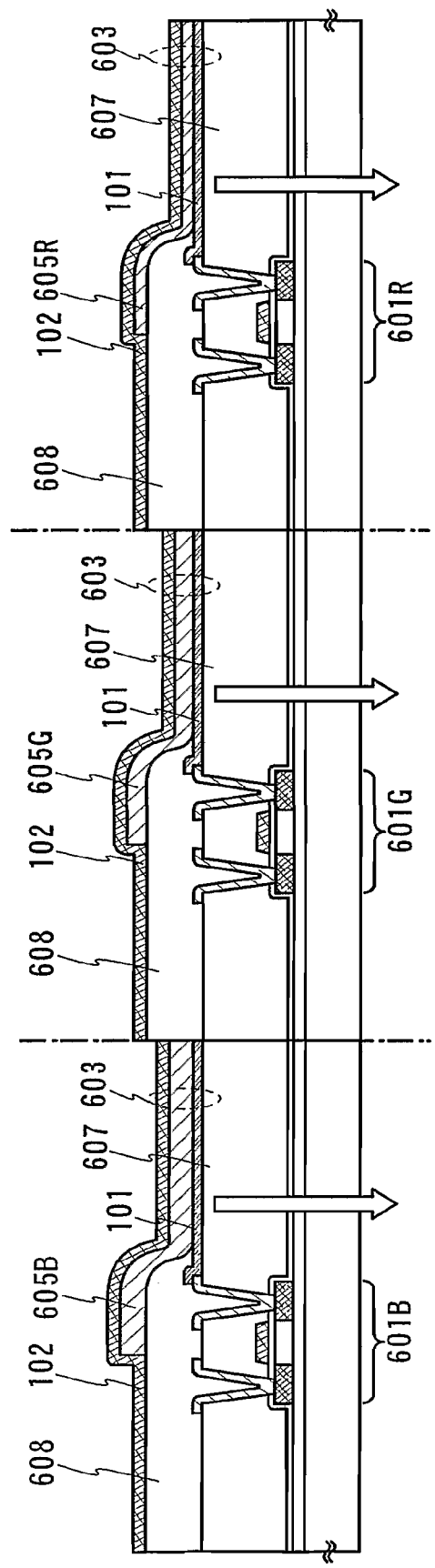
FIG. 4 shows a cross section of a pixel having a light-emitting element according an aspect of the present invention.

Next, FIG. 4 is a cross-sectional view of a pixel having each emission color (ROB) in the case of a bottom emission type in which TFTs 601R, 601G and 601B are each p-channel type and light generated in a light-emitting element 603 is extracted through the second electrode 102.

In FIG. 4, the first electrode 101 of the light-emitting element 603 is electrically connected to the TFTs 601R, 601G and 601B. In addition, electroluminescent layers 605R, 605G and 605B, and the second electrode 102 are sequentially stacked on the first electrode 101.

The TFTs 601R, 601G and 601B can be formed in the same manner as in FIG. 3. In addition, since the bottom emission type is shown in FIG. 4, the first electrode 101 has a light-transmitting property and the second electrode 102 has a non-light-transmitting property. Materials of the electrodes can be referred to the description of the first electrode and the second electrode in FIG. 3.

The electroluminescent layers 605R, 605G and 605B can be formed in the same manner as the electroluminescent layers shown in FIG. 3, and the thickness of any of the first to third layers is different depending on each of R, G and B. Since the bottom emission type is shown in FIG. 4, the thickness of the third layer closest to the second electrode 102 may be made different depending on each emission color. Consequently, decrease in the light-extraction efficiency can be prevented. Preferably, a layer in which an organic compound and a metal oxide are mixed is used as the third layer, thereby preventing the increase of the driving voltage due to the thicker thickness. Note that the thickness of the first layer can be made different depending on each emission color.

In the pixel shown in FIG. 4, light emitted from the light-emitting element 613 can be extracted through the second electrode 102 as shown by the outline arrow.

This embodiment mode can be freely combined with the embodiment modes described above.

Embodiment Mode 8

Embodiment Mode 8 specifically describes a cross-sectional structure of a pixel in the case where a transistor for controlling current supplied to a light-emitting element (driving transistor) is an n-channel thin film transistor (TFT). This embodiment mode describes the case where the first electrode is a cathode and the second electrode is an anode.

Figure 5:
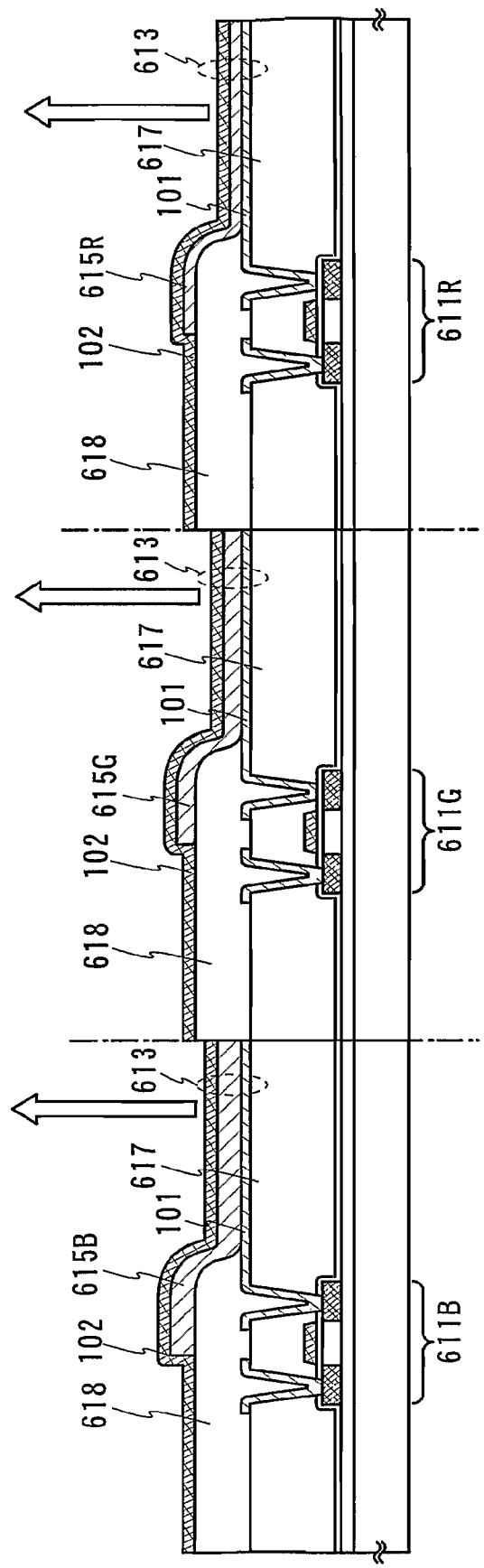
FIG. 5 shows a cross section of a pixel having a light-emitting element according an aspect of the present invention.

Next, FIG. 5 is a cross-sectional view of a pixel in the case of a top emission type in which TFTs 611R, 611G and 611B are each n-channel type and light generated in a light-emitting element 613 is extracted through the second electrode 102. In FIG. 5, the first electrode 101 of the light-emitting element 613 is electrically connected to the TFTs 611R, 611G and 611B. In addition, electroluminescent layers 615R, 615G and 615B, and the second electrode 102 are sequentially stacked on the first electrode 101.

The TFTs 611R, 611G and 611B can be formed in the same manner as TFTs 601R, 601G and 601B in the embodiment mode described above.

Since the top emission type is shown in FIG. 5, the first electrode 101 is formed using a non-light-transmitting material and the second electrode 102 is formed using a light-transmitting material. The materials of the electrodes can be referred to the embodiment modes described above. In addition, since the transistor for controlling supply of current is n-channel type, a wiring connected to the TFTs 611R, 611G and 611B can be used as the first electrode 101.

The electroluminescent layers 615R, 615G and 615B, can be formed in the same manner as the electroluminescent layers 605R, 605G and 605B in the embodiment mode described above. The hole injecting layer, the hole transporting layer, the light-emitting layer, the electron transporting layer and the electron injecting layer are stacked in this order on the first electrode 101, since the first electrode 101 is an anode, when the electroluminescent layer 615 has, in addition to the light-emitting layer, any of the following: the hole injecting layer, the hole transporting layer, the electron transporting layer and the electron injecting layer.

The electroluminescent layers 615R, 615G and 615B correspond to the first to third layers 111, 112 and 113, and the thickness of any of the first to third layers is made different depending on each emission color. Since the top emission type is shown in this embodiment mode, the thickness of the first layer closest to the first electrode 101 is made different depending on each emission color. Consequently, decrease in the light-extraction efficiency can be prevented. Preferably, a layer in which an organic compound and a metal oxide are mixed is used as the first layer, thereby preventing the increase of the driving voltage due to the thicker thickness. Note that the thickness of the third layer can be made different depending on each emission color.

In the pixel shown in FIG. 5, light emitted from the light-emitting element 613 can be extracted through the second electrode 102 as shown by the outline arrow.

Figure 6:
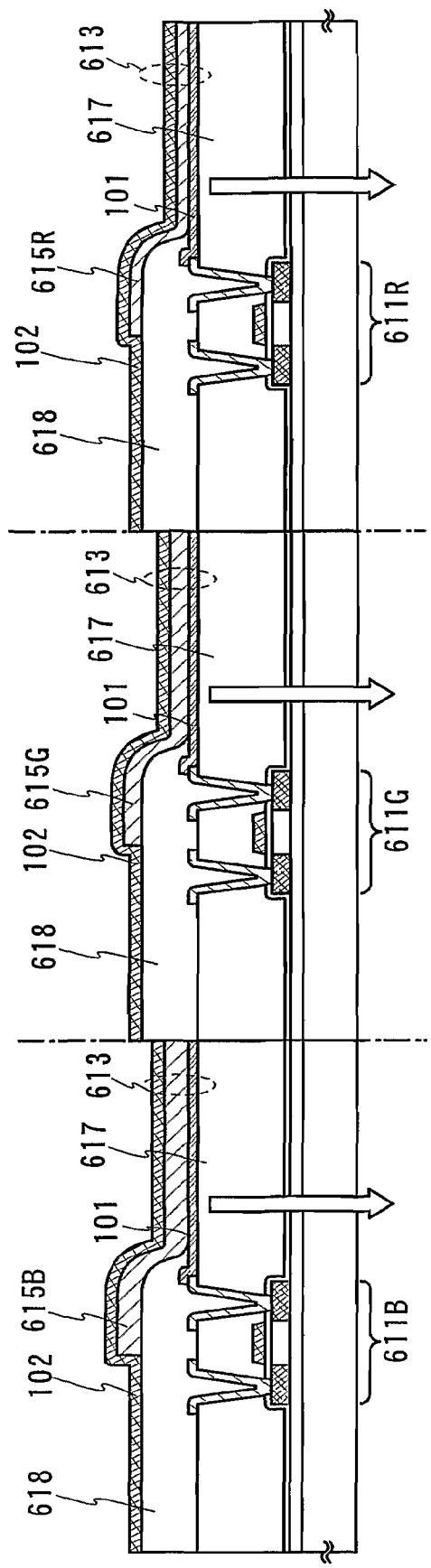
FIG. 6 shows a cross section of a pixel having a light-emitting element according an aspect of the present invention.

Next, FIG. 6 is a cross-sectional view of a pixel having each emission color (RGB), in the case of a bottom emission type in which TFTs 611R, 611G and 611B are each n-channel type and light generated in a light-emitting element 613 is extracted through the first electrode 101.

In FIG. 6, the first electrode 101 of the light-emitting element 613 is electrically connected to the TFTs 611R, 611G and 611B. In addition, electroluminescent layers 615R, 615G and 615B, and the second electrode 102 are sequentially stacked on the first electrode 101.

The TFTs 611R, 611G and 611B can be formed in the same manner as in the embodiment mode described above. In addition, since the bottom emission type is shown in FIG. 6, the first electrode 101 has a light-transmitting property and the second electrode 102 has a non-light-transmitting property. The materials thereof can be referred to the embodiment modes described above.

The electroluminescent layers 615R, 615G and 615B can also be formed in the same manner as in the embodiment modes described above and the thickness of any of the first to third layers is made different depending on each of R, G and B. Note that the hole injecting layer, the hole transporting layer, the light-emitting layer, the electron transporting layer and the electron injecting layer are stacked in this order on the first electrode 101, since the first electrode 101 is an anode, when the electroluminescent layer 615 has, in addition to the light-emitting layer, any of the following: the hole injecting layer, the hole transporting layer, the electron transporting layer and the electron injecting layer.

Since the bottom emission type is shown in FIG. 6, the thickness of the third layer closest to the second electrode 102 is made different depending on each emission color. Consequently, decrease in the light-extraction efficiency can be prevented. Preferably, a layer in which an organic compound and a metal oxide are mixed is used as the third layer, thereby preventing the increase of the driving voltage due to the thicker thickness. Note that the thickness of the first layer can be made different depending on each emission color.

In the pixel shown in FIG. 6, light emitted from the light-emitting element 613 can be extracted through the first electrode 101 as shown by the outline arrow.

This embodiment mode can be freely combined with the embodiment modes described above.

Embodiment Mode 9

Next, an equivalent circuit diagram of a pixel having a light-emitting element is described with reference to FIGS. 7A to 7C.

Figure 7A:
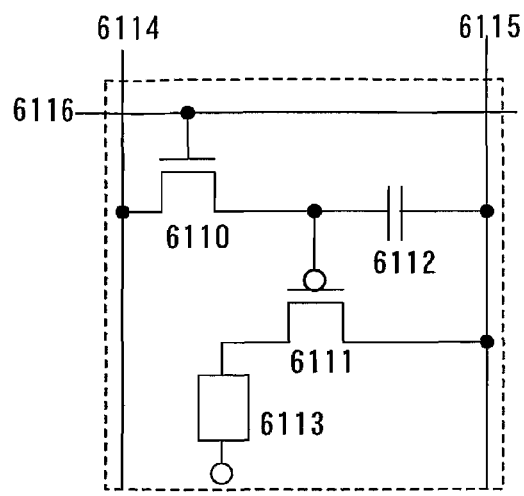
FIGS. 7A to 7C are each an equivalent circuit of a pixel having a light-emitting element according an aspect of the present invention.

FIG. 7A is an example of an equivalent circuit diagram of a pixel, which includes a signal line 6114, a power supply line 6115, a scanning line 6116, a light-emitting element 6113, transistors 6110 and 6111, and a capacitor 6112 at the intersection portion formed by the signal line 6114, the power supply line 6115 and the scanning line 6116. The signal line 6114 is inputted with a video signal by a signal line driver circuit. The transistor 6110 can control supply of the video signal to a gate of the transistor 6111 in accordance with a selection signal inputted to the scanning line 6116. The transistor 6111 is a driving transistor that can control supply of current to the light-emitting element 6113 in accordance with the potential of the video signal. The capacitor 6112 can hold voltage between a gate and a source of the transistor 6111. Note that the capacitor 6112 is provided in FIG. 7A; however, it is not required to be provided if the gate capacitance of the transistor 6111 or the other parasitic capacitance can substitute for it.

Figure 7B:
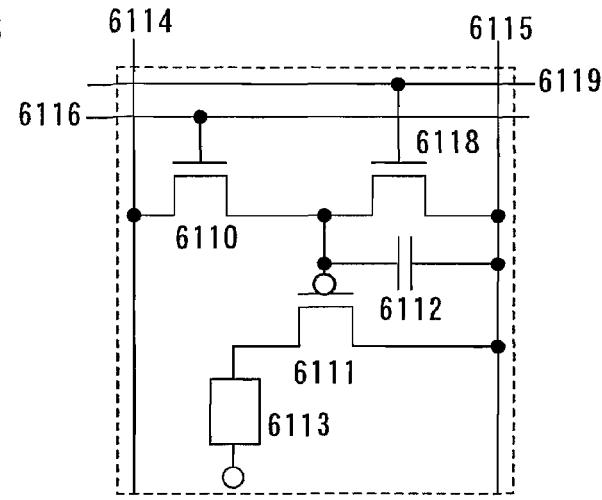

FIG. 7B is an equivalent circuit diagram of a pixel where a transistor 6118 and a scanning line 6119 are additionally provided in the pixel shown in FIG. 7A. By the transistor 6118, potentials of the gate and a source of the transistor 6111 can be equal to each other so as to forcibly flow no current into the light-emitting element 6113. Therefore, the length for a subframe period can be set to be shorter than a period for inputting a video signal into all pixels. In addition, a state in which no current forcibly flows to the light-emitting element 613 can be obtained depending on a driving method, even in the pixel as shown in FIG. 7A.

Figure 7C:
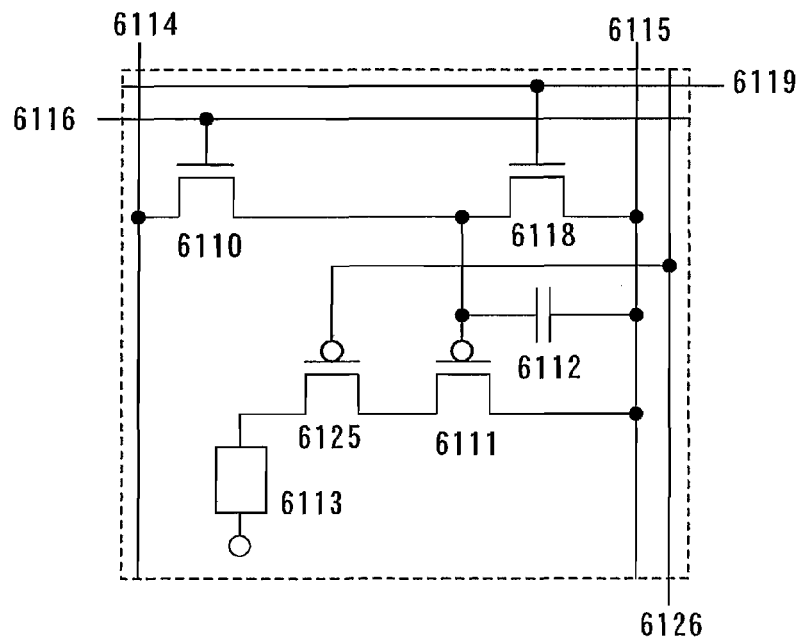

FIG. 7C is an equivalent circuit diagram of a pixel where a transistor 6125 and a wiring 6126 are additionally provided in the pixel shown in FIG. 7B. Gate potential of the transistor 6125 is fixed by the wiring 6126. In addition, the transistors 6111 and 6125 are connected in series between the power supply line 6115 and the light-emitting element 6113. In FIG. 7C, accordingly, the transistor 6125 controls the amount of current supplied to the light-emitting element 6113 while the transistor 6111 controls whether the current is supplied or not to the light-emitting element 6113.

It is to be noted that a configuration of a pixel circuit of the present invention is not limited to those described in this embodiment mode. This embodiment mode can be freely combined with the embodiment modes described above.

Embodiment Mode 10

An electronic device provided with a light-emitting device according the present invention includes: a television set (simply referred to as a TV, or a television receiver), cameras such as a digital camera and a digital video camera, a mobile phone set (simply referred to as a cellular phone set, or a cellular phone), a portable information terminal such as PDA (personal digital assistant), a portable game machine, a monitor for a computer, a computer, a sound reproducing device such as a car audio set, an image reproducing device provided with a recording medium such as a home game machine, and the like. Specific examples thereof are described with reference to FIGS. 8A to 8F.

A portable information terminal shown in FIG. 8A includes a main body 9201, a display portion 9202 and the like. The light-emitting device of the present invention can be applied to the display portion 9202. As a result, the portable information terminal in which the light-extraction efficiency can be maximum, and that can achieve lower power consumption can be provided.

A digital video camera shown in FIG. 8B includes a display portion 9701, a display portion 9702 and the like. The light-emitting device of the present invention can be applied to the display portions 9701 and 9702. As a result, the digital video camera in which the light-extraction efficiency can be maximum, and that can achieve lower power consumption can be provided.

A cellular phone shown in FIG. 8C includes a main body 9101, a display portion 9102 and the like. The light-emitting device of the present invention can be applied to the display portion 9102. As a result, the cellular phone in which the light-extraction efficiency can be maximum, and that can achieve lower power consumption can be provided.

A portable television set shown in FIG. 8D includes a main body 9301, a display portion 9302 and the like. The light-emitting device of the present invention can be applied to the display portion 9302. As a result, the portable television set in which the light-extraction efficiency can be maximum, and that can achieve lower power consumption can be provided. The light-emitting device of the present invention can be applied to various types of television sets such as a small-sized television incorporated in a portable terminal such as a cellular phone, a medium-sized television which is portable, and a large-sized television (for example, 40 inches or more).

A portable computer shown in FIG. 8E includes a main body 9401, a display portion 9402 and the like. The light-emitting device of the present invention can be applied to the display portion 9402. As a result, the portable computer in which the light-extraction efficiency can be maximum, and that can achieve lower power consumption can be provided.

A television set shown in FIG. 8F includes a main body 9501, a display portion 9502 and the like. The light-emitting device of the present invention can be applied to the display portion 9502. As a result, the television set in which the light-extraction efficiency can be maximum, and that can achieve lower power consumption can be provided.

As described above, by using a light-emitting device according to the present invention, electronic devices in which the light-extraction efficiency can be maximum and lower power consumption is achieved can be provided.

EXAMPLES

Example 1

Example 1 shows results of emission intensity of elements emitting each emission color, which were obtained by a multiple interference numerical calculation.

Figure 14:
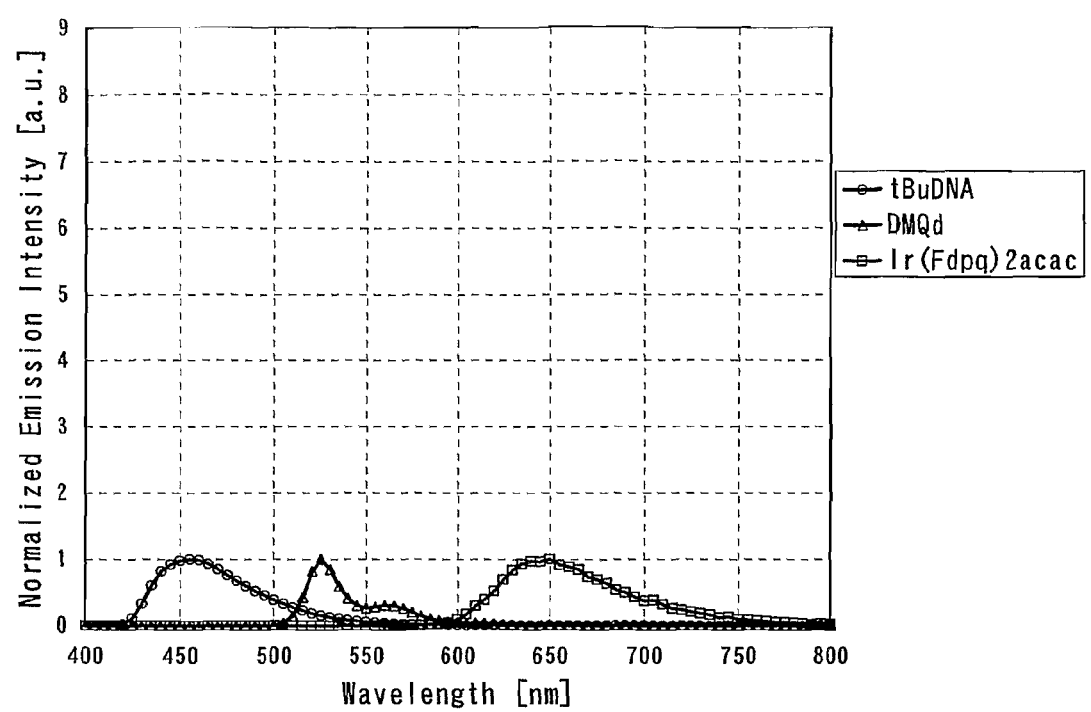
FIG. 14 is a graph showing emission intensity with respect to current density of a light-emitting element.

First, FIG. 14 shows measured results of a photoluminescence spectrum obtained by depositing the second layer which is common in each emission color, in other words, a light-emitting layer, over a glass substrate, exciting it with ultraviolet rays, and measuring the emission spectrum. In FIG. 14, each emission intensity is normalized.

Figure 13:
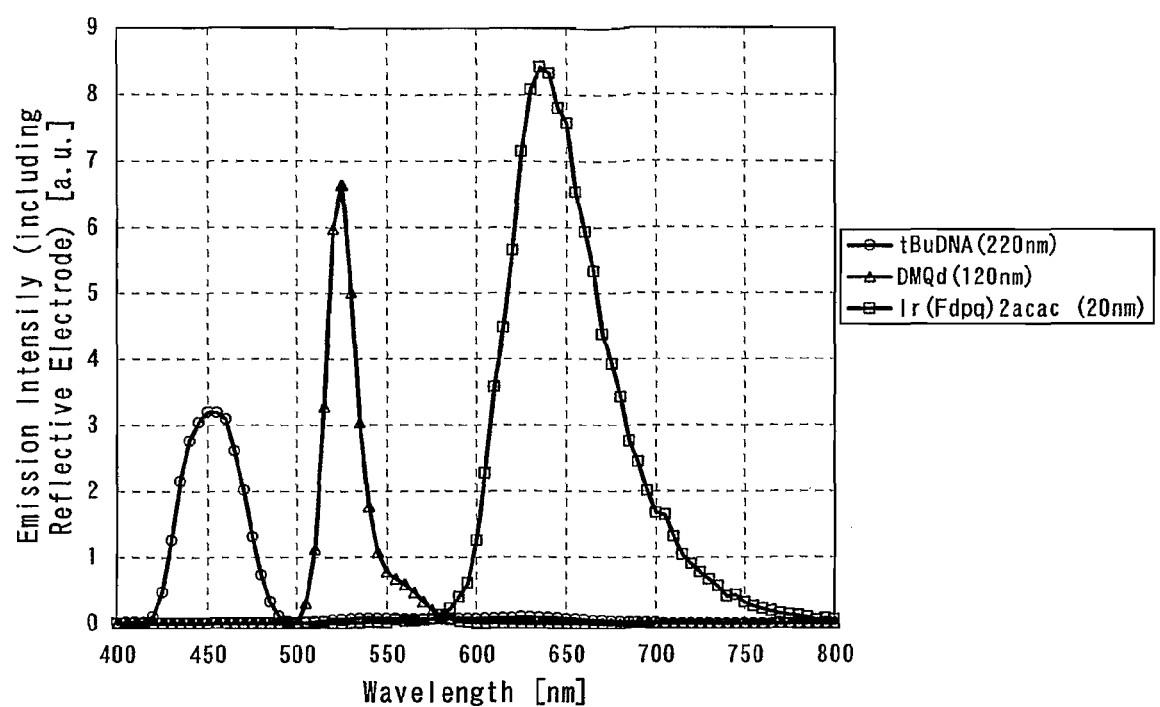
FIG. 13 is a graph showing emission intensity with respect to wavelength of a light-emitting element according to one aspect of the present invention.

Then, FIG. 13 shows results of the emission intensity obtained by a multiple interference numerical calculation. The structure of the element emitting red colored light in FIG. 13 was Al\ITSO\α-NPD:molybdenum oxide:rubrene\α-NPD\Alq3 (Ir [Fdpq]$_2$acac)\Alq$_3$\BzOS:Li\ ITSO that are 100 nm\10 nm\20 nm\10 nm\40 nm\20 nm\20 nm \20 nm\110 nm thick, respectively. Note that [:] means that plural materials were co-evaporated with resistance heating evaporation to be mixed in a layer, and [\] means that each layer was stacked. The layers were stacked in this order from the left. The same is true in the following.

In this element structure, Al and ITSO corresponded to the first electrode 101; α-NPD: molybdenum oxide: rubrene and α-NPD, the first layer 111; Alq$_3$ (Ir [Fdpq]$_2$acac), the second layer 112; Alq$_3$ and BzOS:Li, the third layer 113; and ITSO, the second electrode 102. In this element structure, Al and ITSO were formed by a sputtering method, and the other layers were formed by an evaporation method.

The structure of the element emitting green colored light was Al\ITSO\α-NPD:molybdenum oxide:rubrene\α-NPD\Alq$_3$ (DMQd)\Alq$_3$\BzOS:Li\ITSO that are 100 nm\10 nm\120 nm\10 nm\40 nm\20 nm\20 nm\110 nm thick, respectively. In this element structure, Al and ITSO were formed by a sputtering method, and the other layers were formed by an evaporation method.

In this element structure, Al and ITSO corresponded to the first electrode 101; α-NPD: molybdenum oxide: rubrene and α-NPD, the first layer 111; Alq$_3$ (DMQd), the second layer 112; Alq3 and BzOS:Li, the third layer 113; and ITSO, the second electrode 102.

The structure of the element emitting blue colored light was Al\ITSO\α-NPD:molybdenum oxide:rubrene\α-NPD\tBuDNA\Alq$_3$\BzOS:Li\ITSO that are 100 nm\10 nm\220 nm\10 nm\40 nm\20 nm\20 nm\110 nm thick, respectively. In this element structure, Al and ITSO were formed by a sputtering method, and the other layers were formed by an evaporation method.

In this element structure, Al and ITSO corresponded to the first electrode 101; α-NPD: molybdenum oxide: rubrene and α-NPD, the first layer 111; tBuDNA, the second layer 112; Alq$_3$ and BzOS:Li, the third layer 113; and ITSO, the second electrode 102.

These element structures were top emission type, and the thickness of α-NPD: molybdenum oxide: rubrene closest to the first electrode 101 was different in each of the elements emitting each emission color.

Emission intensity of the elements emitting each emission color in FIG. 13 is higher than that in FIG. 14. In other words, the emission intensity was enhanced by making the thickness of the α-NPD: molybdenum oxide: rubrene different. Consequently, light from the element emitting each emission color were extracted efficiently.

Example 2

One feature of the present invention is that the thickness of the α-NPD:molybdenum oxide: rubrene is large in Example 1. Thus, the relationship between the thickness and driving voltage of the light-emitting element is explained in Example 2.

Figure 9:
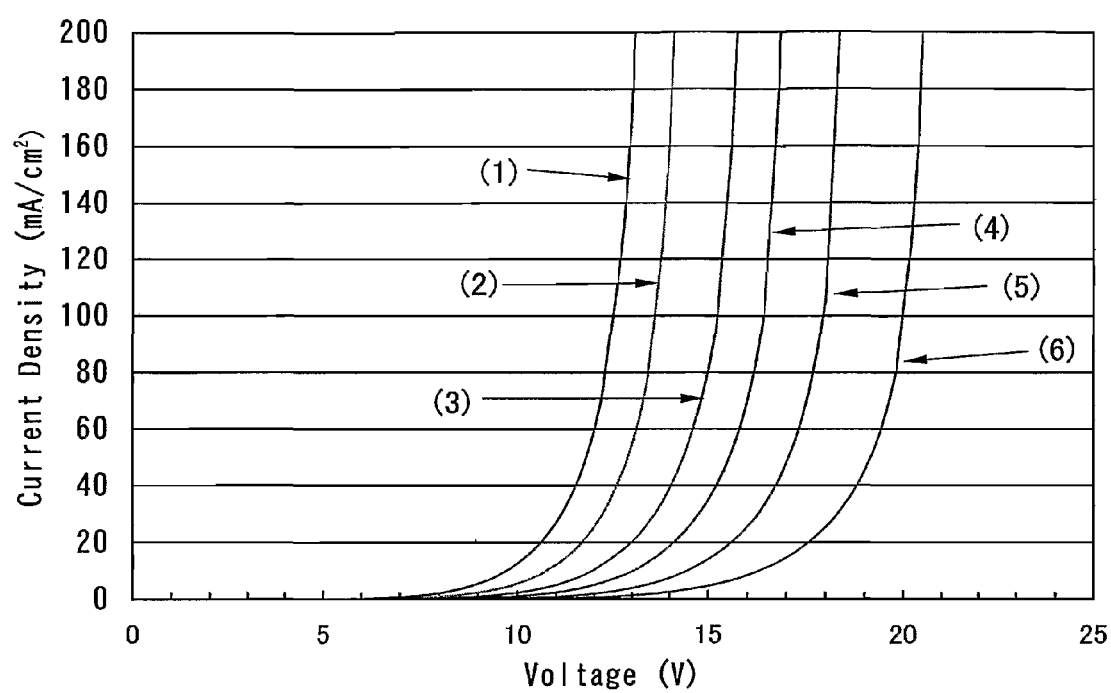
FIG. 9 is a graph of voltage with respect to current density of a light-emitting element.

FIG. 9 shows a graph of current density (mA/cm$^2$) to voltage (V) characteristics in the case where the thickness X of α-NPB is 60 nm thick (sample 1), 80 nm thick (sample 2), 100 nm thick (sample 3), 120 nm thick (sample 4), 140 nm thick (sample 5) and 160 nm thick (sample 6) in an element structure of ITO\CuPc (20 nm)\α-NPB (X nm)\Alq$_3$:DMQd (37.5 nm)\Alq$_3$ (37.5 nm)\calcium fluoride (CaF$_2$) (1 nm)\Al (200 nm). Table 1 shows results of the current density (mA/cm$^2$) to voltage (V) characteristics.

TABLE 1

| Sample | Thickness: X (nm) | Voltage (V)*[1] |
|---|---|---|
| (1) | 60 | 12.5 |
| (2) | 80 | 13.5 |
| (3) | 100 | 15.3 |
| (4) | 120 | 16.5 |
| (5) | 140 | 18.9 |
| (6) | 160 | 19.9 |

As shown in FIG. 9, as the thickness of α-NPB is increased, the voltage is also increased. Accordingly, the driving voltage needed for obtaining a desired current density is also increased as the thickness of α-NPB is increased.

Figure 10:
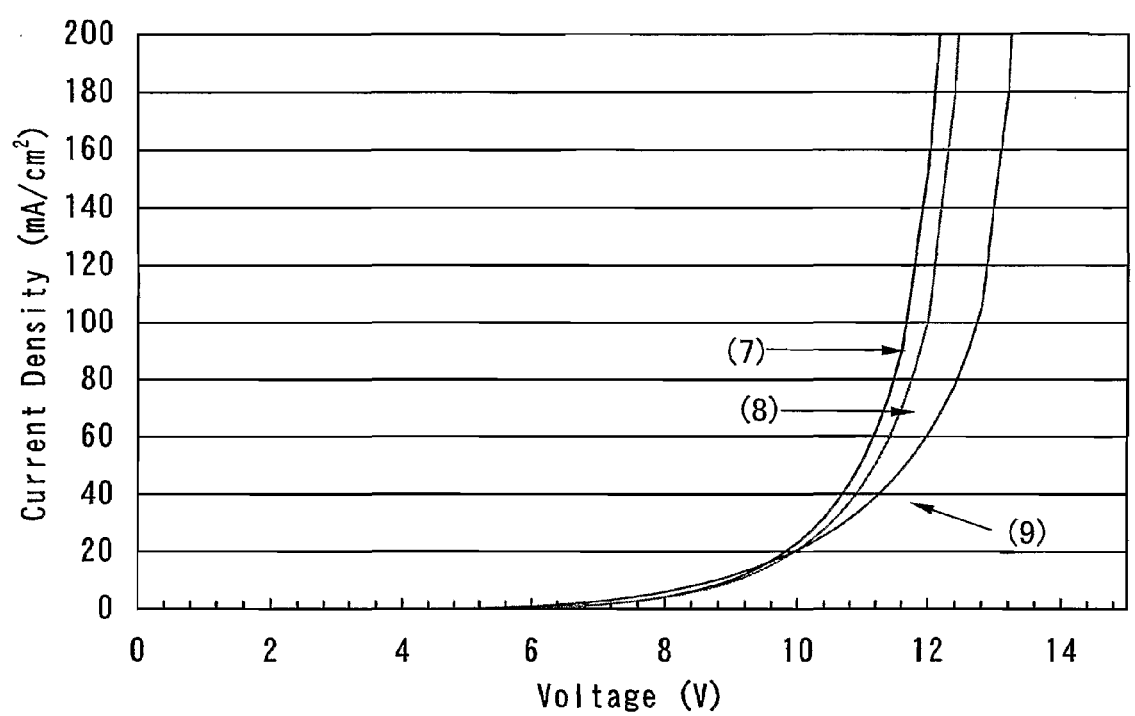
FIG. 10 is a graph of voltage with respect to current density of a light-emitting element.

FIG. 10 shows a graph of current density (mA/cm$^2$) to voltage (V) characteristics in the case where the thickness X of molybdenum oxide was 20 nm thick (sample 7), 50 nm thick (sample 8), and 100 nm thick (sample 9), in an element structure of ITO\molybdenum oxide (X nm)\CuPc (20 nm)\α-NPB (40 nm)\Alq$_3$:DMQd (37.5 nm)\Alq$_3$ (37.5 nm)\calcium fluoride (CaF$_2$) (1 nm)\Al (200 nm). Table 2 shows results of the current density (mA/cm$^2$) to voltage (V) characteristics.

TABLE 2

| Sample | Thickness: X (nm) | Voltage (V)*[1] |
|---|---|---|
| (7) | 20 | 11.7 |
| (8) | 50 | 11.9 |
| (9) | 100 | 12.7 |

As shown in FIG. 10, as the thickness of molybdenum oxide is increased, the voltage is also increased. Accordingly, the driving voltage needed for obtaining a desired current density is also increased as the thickness of molybdenum oxide is increased.

It was recognized that the driving voltage was also increased when the thickness of the light-emitting element was increased.

Figure 11:
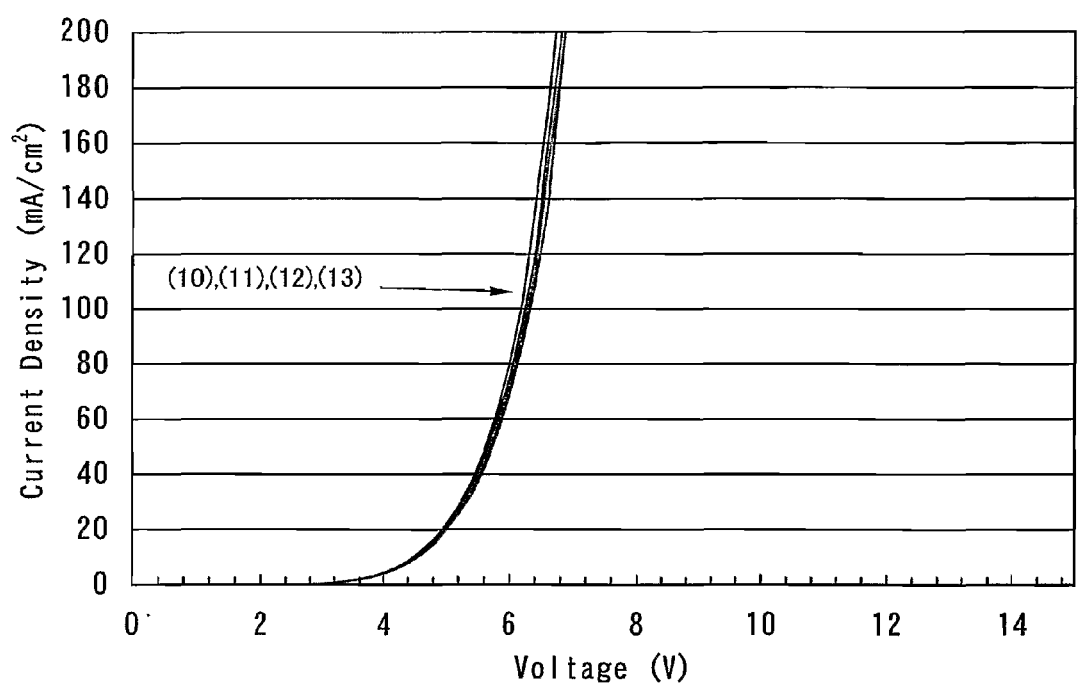
FIG. 11 is a graph of voltage with respect to current density of a light-emitting element according to one aspect of the present invention.

However, the present inventors have found that the driving voltage is not increased even when the thickness is increased, as a result of forming a layer including an organic compound and a metal oxide that is an inorganic compound. DNTPD was used as the organic compound and molybdenum oxide was used as the metal oxide, and they were co-evaporated with resistance heating co-evaporation to form a layer in which DNTPD and molybdenum oxide were mixed. FIG. 11 shows a graph of current density (mA/cm$^2$) to voltage (V) characteristics of the layer in which DNTPD and molybdenum oxide are mixed. Note that the specific element structure was ITSO\DNTPD:molybdenum oxide:rubrene (X nm)\α-NPB (10 nm)\Alq$_3$: Coumarin 6 (37.5 nm)\Alq$_3$ (37.5 nm)\LiF (1 nm)\Al (200 nm), and the thickness of DNTPD: molybdenum oxide:rubrene, namely X was 40 nm thick (sample 10), 80 nm thick (sample 11), 120 nm thick (sample 12), and 160 nm thick (sample 13). Note that it was possible that the reliability was increased by co-evaporating rubrene. Table 3 shows results of the current density (mA/cm$^2$) to voltage (V) characteristics.

TABLE 3

| Sample | Thickness: X (nm) | Voltage (V)*[1] |
|---|---|---|
| (10) | 40 | 6.1 |
| (11) | 80 | 6.3 |
| (12) | 120 | 6.3 |
| (13) | 160 | 6.3 |

As shown in FIG. 11, it is understood that the voltage is not increased and kept almost constant even when the thickness (X nm) of DNTPD:molybdenum oxide:rubrene is increased. In the element used for FIG. 11, the voltage itself is decreased.

The element structures used in FIGS. 9 and 11 are different from those used in Example 1, since the element structures in FIGS. 9 and 11 are used to find the relationship between the thickness of the layer including the organic compound and the metal oxide, and the driving voltage. However, even in the element in the example described above, it is not necessary for the driving voltage to become high, even when the thickness of DNTPD:molybdenum oxide:rubrene is increased. Lower power consumption can be achieved in such a light-emitting device using a light-emitting element in which driving voltage is not needed to be high, even when the thickness is increased.

In addition, by increasing the thickness of DNTPD:molybdenum oxide:rubrene, a short circuit between the first electrode and the second electrode can be prevented. Consequently, productivity of the light-emitting device including the element structure according to the present invention can be increased.

Example 3

In example 3, characteristics of molybdenum oxide that is a metal oxide, α-NPD that is an organic compound having high hole transporting property, and molybdenum oxide:α-NPD were examined. The films of them were each formed by an evaporation method and molybdenum oxide: α-NPD was co-evaporated by resistance heating evaporation.

As shown in Table 4, molybdenum oxide: α-NPD, which was a mixture of molybdenum oxide and α-NPD, had a smaller ionization potential than molybdenum oxide and α-NPD by about 0.1 to 0.2 eV. In other words, it was understood that the hole injecting property is enhanced.

TABLE 4

| Material of Layer | IP$^b$ (eV) |
|---|---|
| MoOx | −5.48 |
| a-NPB | −5.38 |
| MoO$_x$:a-NPB (1:1)$^a$ | −5.37 |
| MoO$_x$:a-NPB (1:0.5)$^a$ | −5.27 |

$^a$mol/mol
$^b$Ionization Potential (surveyed value by B39AC-2)

Figure 12:
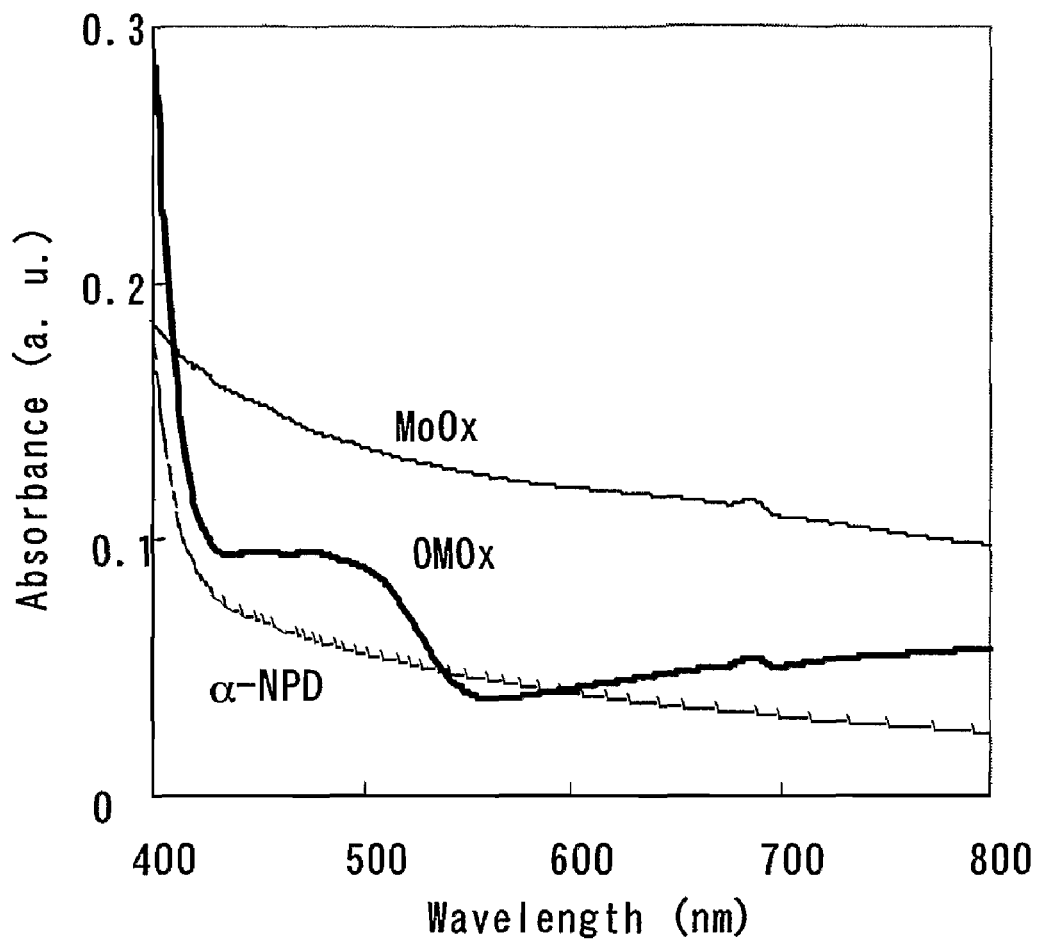
FIG. 12 is a graph showing absorption spectrum of a light-emitting element.

FIG. 12 shows absorption spectrum of the films. Absorption by molybdenum oxide: α-NPD (referred to as OMO$_x$) is more reduced than molubdenum oxide alone. Thus, it can be understood that light-absorption loss can be reduced by forming a light-emitting element using molybdenum oxide: α-NPD rather than molybdenum oxide alone.

As shown in FIG. 12, molybdenum oxide: α-NPD has a new absorption peak around 500 nm, while molybdenum oxide and α-NPD do not have a characteristic peak in a visible light region. It can be thought that this is because a charge transfer complex was formed between molybdenum oxide and α-NPD. The molybdenum oxide served as an acceptor and α-NPD served as a donor. The conductivity was increased and the effect of preventing increase of the driving voltage as described in Example 2 was obtained because the charge transfer complex was formed. Moreover, it is confirmed that an amine based compound such as DNTPD as well as α-NPD can serve as a donor. Carbazole derivatives such as CBP or an aromatic hydrocarbon compound such as t-BuDNA can be applied.

From these experimental results, it was recognized that a synergistic effect was able to be obtained by mixing an organic compound and a specific inorganic compound. The effect was not obtained by a single body thereof. Further, it was recognized that molybdenum oxide that is a metal oxide was preferably used as the inorganic compound.

What is claimed is:

1. A light-emitting device having at least first and second light-emitting elements exhibiting different emission colors, each of the first and second light-emitting elements comprising:
   a first electrode that has a non-light-transmitting property;
   a first layer serving as a layer generating holes over the first electrode;
   a second layer serving as a layer including a light-emitting layer over the first layer;
   a third layer serving as a layer generating electrons over the second layer; and
   a second electrode that has a light transmitting property over the third layer,
   wherein a thickness of the first layer of the first light-emitting element is different from that of the second light-emitting element, and
   wherein the first layer has an absorption peak around 500 nm.

2. The light-emitting device according to claim 1, wherein the first electrode is electrically connected to a transistor provided at an interconnection portion formed by a signal line and a scanning line.

3. The light-emitting device according to claim 1, further comprising a plurality of types of color filters having different optical characteristics over the second electrode.

4. The light-emitting device according to claim 1, wherein the second electrode comprises indium tin oxide including silicon oxide.

5. The light-emitting device according to claim 1,
   wherein an optical distance between the light-emitting layer and the first electrode is (2 m−1)/4-fold of an emission wavelength, and
   wherein m is a positive integer.

6. The light-emitting device according to claim 1, wherein the light-emitting device is incorporated in an electronic device selected from the group consisting of a television set, cameras, a portable information terminal, a monitor for a computer, a computer, a sound reproducing device, and an image reproducing device.

7. The light-emitting device according to claim 1,
   wherein the first light-emitting element generates blue light,
   wherein the second light-emitting element generates red light, and
   wherein the thickness of the first light-emitting element is thicker than that of the second light-emitting element.

8. The light-emitting device according to claim 1, wherein a thickness of the third layer of the first light-emitting element is different from that of the second light-emitting element.

9. A light-emitting device having at least first and second light-emitting elements exhibiting different emission colors, each of the first and second light-emitting elements comprising:
   a first electrode that has a non-light-transmitting property;
   a first layer serving as a layer generating holes over the first electrode;
   a second layer serving as a layer including a light-emitting layer over the first layer;
   a third layer serving as a layer generating electrons over the second layer;
   a fourth layer serving as a layer generating holes over the third layer; and
   a second electrode that has a light transmitting property over the fourth layer,
   wherein a thickness of the first layer of the first light-emitting element is different from that of the second light-emitting element, and
   wherein the first layer has an absorption peak around 500 nm.

10. The light-emitting device according to claim 9, wherein the first electrode is electrically connected to a transistor provided at an interconnection portion formed by a signal line and a scanning line.

11. The light-emitting device according to claim 9, further comprising a plurality of types of color filters having different optical characteristics over the second electrode.

12. The light-emitting device according to claim 9, wherein the second electrode comprises indium tin oxide including silicon oxide.

13. The light-emitting device according to claim 9,
   wherein an optical distance between the light-emitting layer and the first electrode is (2 m−1)/4-fold of an emission wavelength, and
   wherein m is a positive integer.

14. The light-emitting device according to claim 9, wherein the light-emitting device is incorporated in an electronic device selected from the group consisting of a television set, cameras, a portable information terminal, a monitor for a computer, a computer, a sound reproducing device, and an image reproducing device.

15. The light-emitting device according to claim 9,
   wherein the first light-emitting element generates blue light,
   wherein the second light-emitting element generates red light, and
   wherein the thickness of the first light-emitting element is thicker than that of the second light-emitting element.

16. The light-emitting device according to claim 9, wherein a thickness of the third layer of the first light-emitting element is different from that of the second light-emitting element.

17. A light-emitting device having at least first and second light-emitting elements exhibiting different emission colors, each of the first and second light-emitting elements comprising:
   a first electrode that has a non-light-transmitting property;
   a first layer serving as a layer generating holes over the first electrode;
   a second layer serving as a layer including a light-emitting layer over the first layer;
   a third layer serving as a layer generating electrons over the second layer; and
   a second electrode that has a light transmitting property over the third layer,
   wherein the second electrode comprises a semi-transparent metal material, wherein a thickness of the first layer of the first light-emitting element is different from that of the second light-emitting element, and wherein the first layer has an absorption peak around 500 nm.

18. The light-emitting device according to claim 17, wherein the first electrode is electrically connected to a transistor provided at an interconnection portion formed by a signal line and a scanning line.

19. The light-emitting device according to claim 17, further comprising a plurality of types of color filters having different optical characteristics over the second electrode.

20. The light-emitting device according to claim 17, wherein the second electrode comprises indium tin oxide including silicon oxide.

21. The light-emitting device according to claim 17,
wherein an optical distance between the light-emitting layer and the first electrode is (2 m−1)/4-fold of an emission wavelength, and
wherein m is a positive integer.

22. The light-emitting device according to claim 17, wherein the light-emitting device is incorporated in an electronic device selected from the group consisting of a television set, cameras, a portable information terminal, a monitor for a computer, a computer, a sound reproducing device, and an image reproducing device.

23. The light-emitting device according to claim 17,
wherein the first light-emitting element generates blue light,
wherein the second light-emitting element generates red light, and
wherein the thickness of the first light-emitting element is thicker than that of the second light-emitting element.

24. The light-emitting device according to claim 17, wherein a thickness of the third layer of the first light-emitting element is different from that of the second light-emitting element.

25. A light-emitting device having at least first and second light-emitting elements exhibiting different emission colors, each of the first and second light-emitting elements comprising:
a first electrode that has a non-light-transmitting property;
a first layer serving as a layer generating holes over the first electrode;
a second layer serving as a layer including a light-emitting layer over the first layer;
a third layer serving as a layer generating electrons over the second layer;
a fourth layer serving as a layer generating holes over the third layer; and
a second electrode that has a light transmitting property over the fourth layer,
wherein the second electrode comprises a semi-transparent metal material,
wherein a thickness of the first layer of the first light-emitting element is different from that of the second light-emitting element, and
wherein the first layer has an absorption peak around 500 nm.

26. The light-emitting device according to claim 25, wherein the first electrode is electrically connected to a transistor provided at an interconnection portion formed by a signal line and a scanning line.

27. The light-emitting device according to claim 25, further comprising a plurality of types of color filters having different optical characteristics over the second electrode.

28. The light-emitting device according to claim 25, wherein the second electrode comprises indium tin oxide including silicon oxide.

29. The light-emitting device according to claim 25,
wherein an optical distance between the light-emitting layer and the first electrode is (2 m−1)/4-fold of an emission wavelength, and
wherein m is a positive integer.

30. The light-emitting device according to claim 25, wherein the light-emitting device is incorporated in an electronic device selected from the group consisting of a television set, cameras, a portable information terminal, a monitor for a computer, a computer, a sound reproducing device, and an image reproducing device.

31. The light-emitting device according to claim 25,
wherein the first light-emitting element generates blue light,
wherein the second light-emitting element generates red light, and
wherein the thickness of the first light-emitting element is thicker than that of the second light-emitting element.

32. The light-emitting device according to claim 25, wherein a thickness of the third layer of the first light-emitting element is different from that of the second light-emitting element.

* * * * *

UNITED STATES PATENT AND TRADEMARK OFFICE
CERTIFICATE OF CORRECTION

PATENT NO. : 8,188,491 B2
APPLICATION NO. : 13/009111
DATED : May 29, 2012
INVENTOR(S) : Satoshi Seo et al.

It is certified that error appears in the above-identified patent and that said Letters Patent is hereby corrected as shown below:

In the Specifications

At column 7, line 2, "1110" should be --111G--;

At column 7, line 3, "1130" should be --113G--;

At column 9, line 65, "6050" should be --605G--;

At column 10, line 2, "6050" should be --605G--;

At column 15, line 21, "quiuolinato" should be --quinolinato--;

At column 16, line 63, "farmed" should be --formed--;

At column 20, line 11, "ROB" should be --RGB--.

Signed and Sealed this
Seventh Day of May, 2013

Teresa Stanek Rea
*Acting Director of the United States Patent and Trademark Office*